(12) United States Patent
Sandhu et al.

(10) Patent No.: US 9,548,444 B2
(45) Date of Patent: Jan. 17, 2017

(54) MAGNETIC MEMORY CELLS AND METHODS OF FORMATION

(71) Applicant: Micron Technology, Inc., Boise, ID (US)

(72) Inventors: Gurtej S. Sandhu, Boise, ID (US); Wayne I. Kinney, Emmett, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/685,236

(22) Filed: Apr. 13, 2015

(65) Prior Publication Data

US 2015/0214472 A1 Jul. 30, 2015

Related U.S. Application Data

(63) Continuation of application No. 13/427,339, filed on Mar. 22, 2012, now Pat. No. 9,007,818.

(51) Int. Cl.
*H01L 43/08* (2006.01)
*G11C 11/16* (2006.01)
*H01L 43/12* (2006.01)
*H01F 10/32* (2006.01)
*G11C 11/15* (2006.01)
*H01L 43/02* (2006.01)
(Continued)

(52) U.S. Cl.
CPC ............... *H01L 43/08* (2013.01); *G11C 11/15* (2013.01); *G11C 11/161* (2013.01); *H01F 10/3286* (2013.01); *H01L 43/02* (2013.01); *H01L 43/12* (2013.01); *H01F 10/1936* (2013.01); *H01F 10/329* (2013.01); *H01L 27/228* (2013.01)

(58) Field of Classification Search
CPC .......... H01L 43/02; H01L 43/08; H01L 43/12; G11C 11/14; G11C 11/15; G11C 11/16; G11C 11/161
See application file for complete search history.

(56) References Cited

U.S. PATENT DOCUMENTS 4,882,936 A 11/1989 Garshelis
5,768,069 A 6/1998 Mauri
(Continued)

FOREIGN PATENT DOCUMENTS

EP 1353443 A2 10/2003
EP 2385548 A1 11/2011
(Continued)

OTHER PUBLICATIONS

Apalkov et al., Comparison of Scaling of In-Plane and Perpendicular Spin Transfer Switching Technologies by Micromagnetic Simulation, IEEE Transactions on Magnetics, vol. 46, Issue 6, (Jun. 2010), pp. 2240-2243 (abstract only).
(Continued)

*Primary Examiner* — Allison P Bernstein
(74) *Attorney, Agent, or Firm* — TraskBritt

(57) ABSTRACT

Memory cells including cell cores having free regions are disclosed. The free regions exhibit a strain that affects a magnetization orientation within the cell core. A stressor structure may exert a stress upon at least a portion of the cell core to effect the strain state of the free region. Also disclosed are semiconductor device structures and systems including such memory cells as well as methods for forming such memory cells.

20 Claims, 9 Drawing Sheets

(51) Int. Cl.
*H01L 27/22* (2006.01)
*H01F 10/193* (2006.01)

(56) References Cited

U.S. PATENT DOCUMENTS

| | | | |
|---|---|---|---|
| 6,139,648 A * | 10/2000 | Wun-Fogle | H01L 41/47 148/101 |
| 6,166,948 A | 12/2000 | Parkin et al. | |
| 6,258,470 B1 | 7/2001 | Sakakima et al. | |
| 6,275,363 B1 | 8/2001 | Gill | |
| 6,363,000 B2 | 3/2002 | Perner et al. | |
| 6,387,476 B1 | 5/2002 | Iwasaki et al. | |
| 6,483,741 B1 | 11/2002 | Iwasaki et al. | |
| 6,560,135 B2 | 5/2003 | Matsuoka et al. | |
| 6,611,405 B1 | 8/2003 | Inomata et al. | |
| 6,703,249 B2 | 3/2004 | Okazawa et al. | |
| 6,771,534 B2 | 8/2004 | Stipe | |
| 6,806,096 B1 | 10/2004 | Kim et al. | |
| 6,845,038 B1 | 1/2005 | Shukh | |
| 6,970,376 B1 | 11/2005 | Fukuzumi | |
| 6,980,468 B1 | 12/2005 | Ounadjela | |
| 6,992,359 B2 | 1/2006 | Nguyen et al. | |
| 6,998,150 B2 | 2/2006 | Li et al. | |
| 7,026,671 B2 | 4/2006 | Mizuguchi et al. | |
| 7,095,933 B2 | 8/2006 | Barth | |
| 7,130,167 B2 | 10/2006 | Gill | |
| 7,189,583 B2 | 3/2007 | Drewes | |
| 7,230,265 B2 | 6/2007 | Kaiser et al. | |
| 7,239,489 B2 | 7/2007 | Lin et al. | |
| 7,274,080 B1 | 9/2007 | Parkin | |
| 7,282,755 B2 | 10/2007 | Pakala et al. | |
| 7,372,674 B2 | 5/2008 | Gill | |
| 7,378,698 B2 | 5/2008 | Ha et al. | |
| 7,379,280 B2 | 5/2008 | Fukumoto et al. | |
| 7,394,626 B2 | 7/2008 | Fukumoto et al. | |
| 7,486,552 B2 | 2/2009 | Apalkov et al. | |
| 7,488,609 B1 | 2/2009 | Lin et al. | |
| 7,514,160 B2 | 4/2009 | Nagahama et al. | |
| 7,563,486 B2 | 7/2009 | Barth | |
| 7,564,152 B1 | 7/2009 | Clark et al. | |
| 7,602,033 B2 | 10/2009 | Zhao et al. | |
| 7,660,153 B2 | 2/2010 | Yamane et al. | |
| 7,682,841 B2 | 3/2010 | Dahmani et al. | |
| 7,732,881 B2 | 6/2010 | Wang | |
| 7,750,421 B2 | 7/2010 | Horng et al. | |
| 7,791,844 B2 | 9/2010 | Carey et al. | |
| 7,835,173 B2 | 11/2010 | Ma et al. | |
| 7,863,060 B2 | 1/2011 | Belen et al. | |
| 7,885,105 B2 | 2/2011 | Li et al. | |
| 7,919,794 B2 | 4/2011 | Gu et al. | |
| 7,929,370 B2 | 4/2011 | Min | |
| 7,932,572 B2 | 4/2011 | Tsujiuchi | |
| 7,948,044 B2 | 5/2011 | Horng et al. | |
| 8,009,465 B2 | 8/2011 | Nakayama et al. | |
| 8,043,732 B2 | 10/2011 | Anderson et al. | |
| 8,048,492 B2 | 11/2011 | Fukuzawa et al. | |
| 8,068,317 B2 | 11/2011 | Gill | |
| 8,080,432 B2 | 12/2011 | Horng et al. | |
| 8,089,137 B2 | 1/2012 | Lung et al. | |
| 8,102,700 B2 | 1/2012 | Liu et al. | |
| 8,138,561 B2 | 3/2012 | Horng et al. | |
| 8,223,539 B2 | 7/2012 | Smythe et al. | |
| 8,324,697 B2 | 12/2012 | Worledge | |
| 8,334,148 B2 | 12/2012 | Jeong et al. | |
| 8,338,004 B2 | 12/2012 | Shin et al. | |
| 8,357,962 B2 | 1/2013 | Marukame et al. | |
| 8,385,107 B2 | 2/2013 | Prejbeanu | |
| 8,411,498 B2 | 4/2013 | Kim et al. | |
| 8,422,286 B2 | 4/2013 | Ranjan et al. | |
| 8,470,462 B2 | 6/2013 | Horng et al. | |
| 8,487,390 B2 | 7/2013 | Dimitrov et al. | |
| 8,492,169 B2 | 7/2013 | Cao et al. | |
| 8,570,798 B2 | 10/2013 | Meade et al. | |
| 8,587,043 B2 | 11/2013 | Natori et al. | |
| 8,604,573 B2 | 12/2013 | Yamakawa et al. | |
| 8,623,452 B2 | 1/2014 | Zhou | |
| 8,692,342 B2 | 4/2014 | Oh et al. | |
| 8,704,320 B2 | 4/2014 | Zhu et al. | |
| 8,749,003 B2 | 6/2014 | Horng et al. | |
| 8,779,538 B2 | 7/2014 | Chen et al. | |
| 8,803,265 B2 | 8/2014 | Lim et al. | |
| 8,823,118 B2 | 9/2014 | Horng et al. | |
| 8,923,038 B2 | 12/2014 | Kula et al. | |
| 2002/0089874 A1 | 7/2002 | Nickel et al. | |
| 2002/0105827 A1 | 8/2002 | Redon et al. | |
| 2003/0011939 A1 | 1/2003 | Gill | |
| 2003/0064569 A1 | 4/2003 | Takayama et al. | |
| 2003/0103371 A1 | 6/2003 | Kim et al. | |
| 2003/0199104 A1 | 10/2003 | Leuschner et al. | |
| 2004/0075959 A1 | 4/2004 | Gill | |
| 2004/0091744 A1 | 5/2004 | Carey et al. | |
| 2004/0174740 A1 | 9/2004 | Lee et al. | |
| 2004/0224243 A1 | 11/2004 | Yoshizawa et al. | |
| 2004/0233760 A1 | 11/2004 | Guo et al. | |
| 2005/0036361 A1 | 2/2005 | Fukuzumi | |
| 2005/0068683 A1 | 3/2005 | Gill | |
| 2005/0087511 A1 | 4/2005 | Sharma et al. | |
| 2005/0106810 A1 | 5/2005 | Pakala et al. | |
| 2005/0164414 A1 | 7/2005 | Deak | |
| 2005/0173698 A1 | 8/2005 | Drewes | |
| 2005/0189574 A1 | 9/2005 | Nguyen et al. | |
| 2005/0211973 A1 | 9/2005 | Mori et al. | |
| 2006/0038213 A1 | 2/2006 | Mori et al. | |
| 2006/0042930 A1 | 3/2006 | Mauri | |
| 2006/0081953 A1 | 4/2006 | Nguyen et al. | |
| 2006/0114714 A1 | 6/2006 | Kanegae | |
| 2006/0118842 A1 | 6/2006 | Iwata | |
| 2006/0261425 A1 | 11/2006 | Suemitsu et al. | |
| 2007/0008661 A1 | 1/2007 | Min et al. | |
| 2007/0035890 A1 | 2/2007 | Sbiaa | |
| 2007/0053112 A1 | 3/2007 | Papworth Parkin | |
| 2007/0086121 A1 | 4/2007 | Nagase et al. | |
| 2007/0188945 A1 | 8/2007 | Fuji et al. | |
| 2007/0217071 A1 | 9/2007 | Inamura et al. | |
| 2007/0297220 A1 | 12/2007 | Yoshikawa et al. | |
| 2008/0164502 A1 | 7/2008 | Fukumoto et al. | |
| 2008/0164548 A1* | 7/2008 | Ranjan | G11C 11/16 257/421 |
| 2008/0179699 A1 | 7/2008 | Horng et al. | |
| 2008/0205130 A1 | 8/2008 | Sun et al. | |
| 2008/0225581 A1 | 9/2008 | Yamane et al. | |
| 2008/0278867 A1 | 11/2008 | Fukumoto et al. | |
| 2009/0039450 A1 | 2/2009 | Lee et al. | |
| 2009/0079018 A1 | 3/2009 | Nagase et al. | |
| 2009/0096043 A1 | 4/2009 | Min et al. | |
| 2009/0108383 A1 | 4/2009 | Horng et al. | |
| 2009/0190262 A1 | 7/2009 | Murakami et al. | |
| 2009/0229111 A1 | 9/2009 | Zhao et al. | |
| 2009/0257151 A1 | 10/2009 | Zhang et al. | |
| 2010/0034014 A1 | 2/2010 | Ohno et al. | |
| 2010/0080036 A1 | 4/2010 | Liu et al. | |
| 2010/0080048 A1 | 4/2010 | Liu et al. | |
| 2010/0102406 A1 | 4/2010 | Xi et al. | |
| 2010/0109110 A1 | 5/2010 | Wang et al. | |
| 2010/0110783 A1 | 5/2010 | Liu et al. | |
| 2010/0148167 A1 | 6/2010 | Whig et al. | |
| 2010/0171086 A1 | 7/2010 | Lung et al. | |
| 2010/0176472 A1* | 7/2010 | Shoji | B82Y 25/00 257/421 |
| 2010/0177557 A1 | 7/2010 | Liu et al. | |
| 2010/0177561 A1 | 7/2010 | Liu et al. | |
| 2010/0200899 A1 | 8/2010 | Marukame et al. | |
| 2010/0200939 A1 | 8/2010 | Hosomi et al. | |
| 2010/0230769 A1 | 9/2010 | Ozaki et al. | |
| 2010/0240151 A1 | 9/2010 | Belen et al. | |
| 2010/0327248 A1 | 12/2010 | Khoueir et al. | |
| 2011/0007429 A1 | 1/2011 | Dimitrov et al. | |
| 2011/0007543 A1 | 1/2011 | Khoury | |
| 2011/0014500 A1 | 1/2011 | Horng et al. | |
| 2011/0031569 A1 | 2/2011 | Watts et al. | |
| 2011/0049657 A1 | 3/2011 | Tsukamoto et al. | |
| 2011/0049658 A1 | 3/2011 | Zheng et al. | |
| 2011/0051503 A1 | 3/2011 | Hu et al. | |
| 2011/0062537 A1 | 3/2011 | Oh et al. | |

(56) References Cited

U.S. PATENT DOCUMENTS

| | | |
|---|---|---|
| 2011/0064969 A1 | 3/2011 | Chen et al. |
| 2011/0096443 A1 | 4/2011 | Zhang et al. |
| 2011/0121366 A1 | 5/2011 | Or-Bach et al. |
| 2011/0145514 A1 | 6/2011 | Lee et al. |
| 2011/0149646 A1 | 6/2011 | Liu et al. |
| 2011/0149647 A1 | 6/2011 | Kim et al. |
| 2011/0149670 A1 | 6/2011 | Heo et al. |
| 2011/0170339 A1 | 7/2011 | Wunderlich et al. |
| 2011/0170341 A1 | 7/2011 | Butler |
| 2011/0241138 A1 | 10/2011 | Hsieh et al. |
| 2011/0260274 A1 | 10/2011 | Zheng et al. |
| 2011/0266642 A1 | 11/2011 | Viala et al. |
| 2011/0269251 A1 | 11/2011 | Kim et al. |
| 2011/0293967 A1 | 12/2011 | Zhang et al. |
| 2011/0303995 A1 | 12/2011 | Worledge |
| 2011/0303997 A1 | 12/2011 | Wang et al. |
| 2011/0309418 A1 | 12/2011 | Nakayama et al. |
| 2012/0012952 A1 | 1/2012 | Chen et al. |
| 2012/0012953 A1 | 1/2012 | Lottis et al. |
| 2012/0012954 A1* | 1/2012 | Yamada ............ B82Y 25/00 257/421 |
| 2012/0015099 A1 | 1/2012 | Sun et al. |
| 2012/0018823 A1 | 1/2012 | Huai et al. |
| 2012/0040207 A1 | 2/2012 | Horng et al. |
| 2012/0069647 A1 | 3/2012 | Kramer et al. |
| 2012/0074511 A1 | 3/2012 | Takahashi et al. |
| 2012/0075922 A1* | 3/2012 | Yamada ............ B82Y 25/00 365/158 |
| 2012/0075927 A1 | 3/2012 | Chen et al. |
| 2012/0106233 A1 | 5/2012 | Katti |
| 2012/0134201 A1 | 5/2012 | Ogimoto |
| 2012/0135273 A1 | 5/2012 | Horng et al. |
| 2012/0146167 A1 | 6/2012 | Huai et al. |
| 2012/0155156 A1 | 6/2012 | Watts et al. |
| 2012/0205758 A1 | 8/2012 | Jan et al. |
| 2012/0217594 A1* | 8/2012 | Kajiyama ............ G11C 11/161 257/421 |
| 2012/0218813 A1 | 8/2012 | Oh et al. |
| 2012/0225499 A1 | 9/2012 | Nozieres et al. |
| 2012/0236631 A1 | 9/2012 | Park et al. |
| 2012/0241878 A1 | 9/2012 | Hu et al. |
| 2012/0267733 A1 | 10/2012 | Hu et al. |
| 2012/0280336 A1 | 11/2012 | Jan et al. |
| 2012/0286382 A1 | 11/2012 | Jan et al. |
| 2012/0299134 A1 | 11/2012 | Jan et al. |
| 2012/0299137 A1 | 11/2012 | Worledge |
| 2012/0326252 A1 | 12/2012 | Yamakawa et al. |
| 2013/0005052 A1 | 1/2013 | Hu et al. |
| 2013/0028013 A1 | 1/2013 | Ikeda et al. |
| 2013/0032911 A1 | 2/2013 | Jung et al. |
| 2013/0042081 A1 | 2/2013 | Park et al. |
| 2013/0059168 A1 | 3/2013 | Tahmasebi et al. |
| 2013/0062714 A1* | 3/2013 | Zhu ............ G11C 11/16 257/421 |
| 2013/0064011 A1 | 3/2013 | Liu et al. |
| 2013/0069185 A1 | 3/2013 | Saida et al. |
| 2013/0095656 A1 | 4/2013 | Matsui et al. |
| 2013/0140658 A1 | 6/2013 | Yamane et al. |
| 2013/0146996 A1 | 6/2013 | Yu et al. |
| 2013/0228884 A1 | 9/2013 | Zheng et al. |
| 2013/0229866 A1 | 9/2013 | Ranjan et al. |
| 2013/0250661 A1 | 9/2013 | Sandhu et al. |
| 2013/0313665 A1 | 11/2013 | Rhie et al. |
| 2013/0334631 A1 | 12/2013 | Kinney et al. |
| 2014/0008742 A1 | 1/2014 | Chen et al. |
| 2014/0027869 A1 | 1/2014 | Lee et al. |
| 2014/0099735 A1 | 4/2014 | Horng et al. |
| 2014/0131822 A1 | 5/2014 | Shoji |
| 2015/0028439 A1 | 1/2015 | Kula et al. |
| 2015/0069556 A1 | 3/2015 | Yamakawa et al. |
| 2015/0076485 A1 | 3/2015 | Sandhu et al. |
| 2015/0076633 A1 | 3/2015 | Siddik et al. |

FOREIGN PATENT DOCUMENTS

| | | | |
|---|---|---|---|
| EP | 2541554 A1 | 1/2013 | |
| EP | 2015307 B1 | 4/2013 | |
| GB | 2343308 A | 5/2000 | |
| JP | 2002314049 A | 10/2002 | |
| JP | 2004104076 A | 4/2004 | |
| JP | 2007220854 A | 8/2007 | |
| JP | 2007525847 A | 9/2007 | |
| JP | 2009-026944 A | 2/2009 | |
| JP | 2009194366 A | 8/2009 | |
| JP | 2010165790 A | 7/2010 | |
| JP | 2012009786 A | 1/2012 | |
| JP | 2012009804 A | 1/2012 | |
| JP | 2012182219 A | 9/2012 | |
| JP | 2013008868 A | 1/2013 | |
| KR | 1020040092342 A | 11/2004 | |
| KR | 1020070094431 A | 9/2007 | |
| KR | 1020080029852 A | 4/2008 | |
| KR | 1020120008295 A | 1/2012 | |
| WO | 2010026831 A1 | 3/2010 | |
| WO | WO 2010026831 A1 * | 3/2010 | ............ B82Y 25/00 |
| WO | 2010134378 A1 | 11/2010 | |
| WO | WO 2010134378 A1 * | 11/2010 | ............ B82Y 25/00 |
| WO | 2011001746 A1 | 1/2011 | |
| WO | 2011149274 A2 | 12/2011 | |
| WO | 2011159422 A1 | 12/2011 | |
| WO | 2012128891 A1 | 9/2012 | |
| WO | 2012160937 A1 | 11/2012 | |

OTHER PUBLICATIONS

Auwarter et al., Co on h-Bn/Ni(1 1 1): From Island to Island-Chain Formation and Co Intercalation, Surface Science, vol. 511, (2002), pp. 379-386.

Bai et al., Boron Diffusion Induced Symmetry Reduction and Scattering in CoFeB/MgO/CoFeB Magnetic Tunnel Junctions, Phys. Rev. B, vol. 87, (Jan. 23, 2013), pp. 014114 (abstract only).

Braun et al., Strain-Induced Perpendicular Magnetic Anisotropy in Ultrathin Ni Films on Cu3Au(0 0 1), Journal of Magnetism and Magnetic Materials, vol. 171, (1997), pp. 16-28.

Carrey et al., Influence of Interface Alloying on the Magnetic Properties of Co/Pd Multilayers, Applied Physics Letters, vol. 83, No. 25, (Dec. 22, 2003), pp. 5259-5261.

Cha et al, Atomic-Scale Spectroscopic Imaging of CoFeB/Mg-B-O/CoFeB Magnetic Tunnel Junctions, Applied Physics Letters, vol. 95, (2009), pp. 032506-1-032506-3.

Chen et al, Advances and Future Prospects of Spin-Transfer Torque Random Access Memory, IEEE Transactions on Magnetics, vol. 26, No. 6, (Jun. 2010), pp. 1873-1878.

Chen et al., Magnetic Cell Structures, and Methods of Fabrication, U.S. Appl. No. 14/558,367, filed Dec. 2, 2014.

Diao et al., Spin Transfer Switching in Dual MgO Magnetic Tunnel Junctions, Applied Physics Letters, vol. 90, (2007), pp. 132508-1-132508-3.

Djayaprawira et al., 230% Room-Temperature Magnetoresistance in CoFeB/MgO/CoFeB Magnetic Tunnel Junctions, Applied Physics Letters, vol. 86, Issue 9, (2005), 2 pages (abstract only).

Farle et al., the Temperature Dependence of Magnetic Anisotropy in Ultra-Thin Films, Journal of Magnetism and Magnetic Materials, vol. 165, (1997), pp. 74-77.

Gan et al., Origin of the Collapse of Tunnel Magnetoresistance at High Annealing Temperature in CoFeB/MgO Perpendicular Magnetic Tunnel Junctions, Applied Physics Letters, vol. 99, (2011), pp. 252507-1-252507-3.

Gao et al., Combinatorial Exploration of Rare-Earth-Free Permanent Magnets: Magnetic and Microstructural Properties of Fe-Co-W Thin Films, Applied Physics Letters, vol. 102, (2013), pp. 022419-1-022419-4.

Hayakawa et al., Dependence of Giant Tunnel Magnetoresistance of Sputtered CoFeB/MgO/CoFeB Magnetic Tunnel Junctions on MgO Barrier Thickness and Annealing Temperature, Japanese Journal of Applied Physics, vol. 44, No. 19, (2005), pp. L587-L589.

(56) References Cited

OTHER PUBLICATIONS

Heczko et al., Strain and Concurrent Magnetization Changes in Magnetic Shape Memory Ni-Mn-Ga Single Crystals — Experiment and Model, Materials Science and Engineering A, vol. 481-482, (2008), pp. 283-287.

Hendrych et al., Magnetic Behavior and Domain Structure in As-Quenched, Annealed, and Stress-Annealed CoFeCrSiB Ribbons, Journal of Magnetism and Magnetic Materials, vol. 321, (2009), pp. 3771-3777.

Ikeda et al., Tunnel Magnetoresistance of 604% at 300 K by Suppression of Ta Diffusion in CoFeB/MgO/CoFeB Pseudo-Spin-Valves Annealed at High Temperature, Applied Physics Letters, vol. 93, (2008), pp. 082508-1-082508-3.

International Search Report from the ISA/KR for International Application No. PCT/US2013/033344, (dated Jun. 28, 2013), 3 pages.

Written Opinion of the ISA/KR for International Application No. PCT/US2013/033344, (dated Jun. 28, 2013), 6 pages.

Ke et al., Oxygen-Vacancy-Induced Diffusive Scattering in Fe/MgO/Fe Magnetic Tunnel Junctions, Physical Review Letters, vol. 105, (Nov. 30, 2010), pp. 236801-1-236801-4.

Kim et al, Effect of Annealing on Magnetic Exchange Coupling in CoPt/Co Bilayer Thin Films, Journal of Applied Physics, vol. 87, No. 9, (May 1, 2000), pp. 6140-6142.

Kim et al, Enhancement of Data Retention and Write Current Scaling for Sub-20nm STT-MRAM by Utilizing Dual Interfaces for Perpendicular Magnetic Anisotropy, VLSI Technology (VLSIT), 2012 Symposium, (Jun. 12-14, 2012), 1 pages (abstract only).

Ko et al., Effects of MgO and MgO/Pd Seed-Layers on Perpendicular Magnetic Anisotropy of CoPd Thin Films, Thin Solid Films, vol. 519, (2011), pp. 8252-8255.

Kohda et al., Width and Temperature Dependence of Lithography-Induced Magnetic Anisotropy in (Ga,Mn)As Wires, Physica E, vol. 42, (2010), pp. 2685-2689.

Lavrijsen et al., Tuning the Interlayer Exchange Coupling Between Single Perpendicularly Magnetized CoFeB Layers, Appl. Phys. Lel, vol. 100, (2012), pp. 052411-1-052411-5.

Lohndorf et al., Characterization of Magnetostrictive TMR Pressure Sensors by MOKE, Journal of Magnetism and Magnetic Materials, vol. 316, (2007), pp. e223-e225.

Ma et al., NiO-Thickness Dependent Magnetic Anisotropies in Fe/NiO/Au(001) and Fe1NiO1Mg0(001) Systems, Journal of Magnetism and Magnetic Materials, vol. 324, (2012), pp. 528-533.

Maehara et al., Tunnel Magnetoresistance Above 170% and Resistance-Area Product of 1 Ω (μm)2 Attained by in Situ Annealing of Ultra-Thin MgO Tunnel Barrier, Applied Physics Express, vol. 4, (2011), 2 pages (abstract only).

Matsumoto et al., Dependence on Annealing Temperatures of Tunneling Spectra in High-Resistance CoFeB/MgO/CoFeB Magnetic Tunnel Junctions, Solid State Communications, vol. 143, (2007), pp. 574-578.

Matsumoto et al., Tunneling Spectra of Sputter-Deposited CoFeB/MgO/CoFeB Magnetic Tunnel Junctions Showing Giant Tunneling Magnetoresistance Effect, Solid State Communications, vol. 136, (2005), pp. 611-615.

Meade et al., Memory Cells, Methods of Fabrication, and Semiconductor Devices, U.S. Appl. No. 14/256,655, filed Apr. 18, 2014.

Miao et al., Disturbance of Tunneling Coherence by Oxygen Vacancy in Epitaxial Fe/MgO/Fe Magnetic Tunnel Junctions, Physical Review Letters, vol. 100, (Jun. 19, 2008), pp. 246803-1-246803-4.

Miracle et al., An Assessment of Binary Metallic Glasses: Correlations Between Structure, Glass Forming Ability and Stability (Preprint), Air Force Research Laboratory, (2011), 97 pages.

Miura et al., CoFeB/MgO Based Perpendicular Magnetic Tunnel Junctions with Stepped Structure for Symmetrizing Different Retention Times of "0" and "1" Information, 2011 Symposium on VLSI Technology (VLSIT), (Jun. 14-16, 2011), 19 pages.

Moroz et al., Modeling the Impact of Stress on Silicon Processes and Devices, Materials Science in Semiconductor Processing, vol. 6, (2003), pp. 27-36.

Moutis et al, Voltage-Induced Modification in Magnetic Coercivity of Patterned Co50Fe50 Thin Film on Piezoelectric Substrate, Journal of Magnetism and Magnetic Materials, vol. 320, (2008), pp. 1050-1055.

Nishitani et al., Magnetic Anisotropy in a Ferromagnetic (Ga,Mn)Sb Thin Film, Physica E, vol. 42, (2010), pp. 2681-2684.

Piramanayagam, S. N., Perpendicular Recording Media for Hard Disk Drives, Journal of Applied Physics, vol. 102, (2007), pp. 011301-1-011301-22.

Resnik et al., Mechanical Stress in Thin Film Microstructures on Silicon Substrate, Vacuum, vol. 80, (2005), pp. 236-240.

Rodmacq et al., Influence of Thermal Annealing on the Perpendicuular Magnetic Anisotropy of Pt/Co/AlOx Trilayers, Physical Review B, vol. 79, (2009), pp. 024423-1-024423-8.

Sandhu et al., Memory Cells, Semiconductor Structures, Semiconductor Devices, and Methods of Fabrication, U.S. Appl. No. 14/249,183, filed Apr. 9, 2014.

Sandhu et al., Memory Cells, Semiconductor Devices, and Methods of Fabrication, U.S. Appl. No. 14/516,347, filed Oct. 16, 2014.

Sato et al., Perpendicular-Anisotropy CoFeB-MgO Magnetic Tunnel Junctions with a MgO/CoFeB/Ta/CoFeB/MgO Recording Structure, Applied Physics Letters, vol. 101, (2012), pp. 022414-1-022414-4.

Siddik et al., Memory Cells, Methods of Fabrication, and Semiconductor Devices, U.S. Appl. No. 14/193,979, filed Feb. 28, 2014.

Siddik et al., Semiconductor Devices, Magnetic Tunnel Junctions, and Methods of Fabrication Thereof, U.S. Appl. No. 14/597,903, filed Jan. 15, 2015.

Stone et al., Tuning of Ferromagnetism Through Anion Substitution in Ga-Mn-Pnictide Ferromagnetic Semiconductors, Physica B, vol. 401-402, (2007), pp. 454-457.

Tao et al., Uniform Wafer-Scale Chemical Vapor Deposition of Graphene on Evaporated Cu (1 1 1) Film with Quality Comparable to Exfoliated Monolayer, J. Physical Chemistry, vol. 116, (2012), pp. 24068-24074.

Vitos et al., The Surface Energy of Metals, Surface Science, vol. 411, (1998), pp. 186-202.

Wang et al, Exchange Coupling Between Ferromagnetic and Antiferromagnetic Layers Via Ru and Application for a Linear Magnetic Field Sensor, Journal of Applied Physics, vol. 99, (2006), pp. 08H703-1-08H703-3.

Wang et al., C-Spin Kickoff Meeting Presentation, Semiconductor Research Corp., (Mar. 26, 2013), Minneapolis, Minnesota, (available at https://www.src.org/library/publication/p066203/), 195 pages.

Search Report of ROC (Taiwan) Patent Application No. 102110383, (dated Jan. 22, 2015), 1 page.

Search Report of the State Intellectual Property Office, China Patent Application No. 201380015791.9, dated Jun. 9, 2015, 2 pages.

Japanese Office Action for Japanese Application No. 2015-501917, dated Sep. 1, 2015, 23 pages (including translation).

Extended European Search Report for European Application No. 13764214.6, dated Nov. 3, 2015, 5 pages.

Korean Office Action for Korean Patent Application No. 10-2014-7027909, (dated Jan. 11, 2016), 4 pages (6 pages with translation).

Wilson et al., New Materials for Micro-Scale Sensors and Actuators: an Engineering Review, Materials Science and Engineering R, vol. 56, (2007), pp. 1-129.

Worledge et al., Magnetoresistance Measurement of Unpatterned Magnetic Tunnel Junction Wafers by Current-in-Plane Tunneling, Applied Physics Letters, vol. 83, No. 1, (Jul. 7, 2013), pp. 84-86.

Worledge et al., Spin Torque Switching of Perpendicular Ta|CoFeB|MgO-Based Magnetic Tunnel Junctions, Applied Physics Letters, vol. 98, (2011), pp. 022501-1-022501-3.

Wu et al., Tuning Magnetic Anisotropies of Fe Films on Si(111) Substrate Via Direction Variation of Heating Current, Scientific Reports, vol. 3, (Mar. 26, 2013), pp. 1-5.

You et al., Spin Transfer Torque and Tunneling Magnetoresistance Dependences on Finite Bias Voltages and Insulator Barrier Energy, Thin Solid Films, vol. 519, (2011), pp. 8247-8251.

(56) References Cited

OTHER PUBLICATIONS

Yu et al., 1/f Noise in MgO Double-Barrier Magnetic Tunnel Junctions, Applied Physics Letters, vol. 98, (2011), pp. 112504-1-112504-3.
Zhang, Anisotropic Magnetomechanical Effect in Tb0.3Dy0.7Fe2 Alloy, Journal of Magnetism and Magnetic Materials, vol. 324, (2012), pp. 190-195.
Zhu et al., Magnetic Tunnel Junctions, MaterialsToday, vol. 9, No. 11, (Nov. 2006), pp. 36-45.
Office Action for Korean Patent Application No. 10-2014-7027909, (dated Jul. 25, 2016), 5 pages with translation.

* cited by examiner

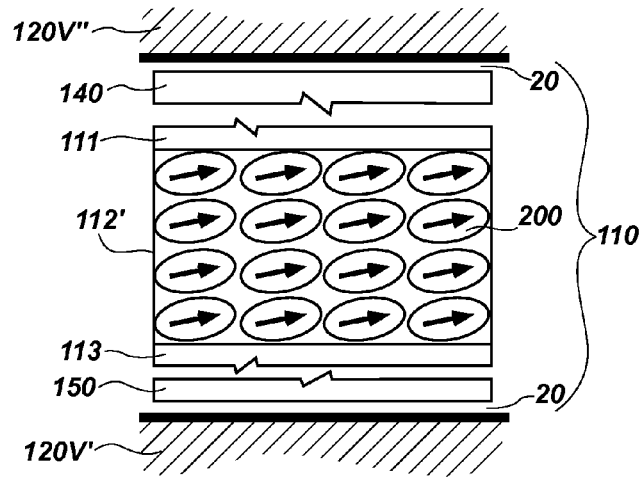
FIG. 6A
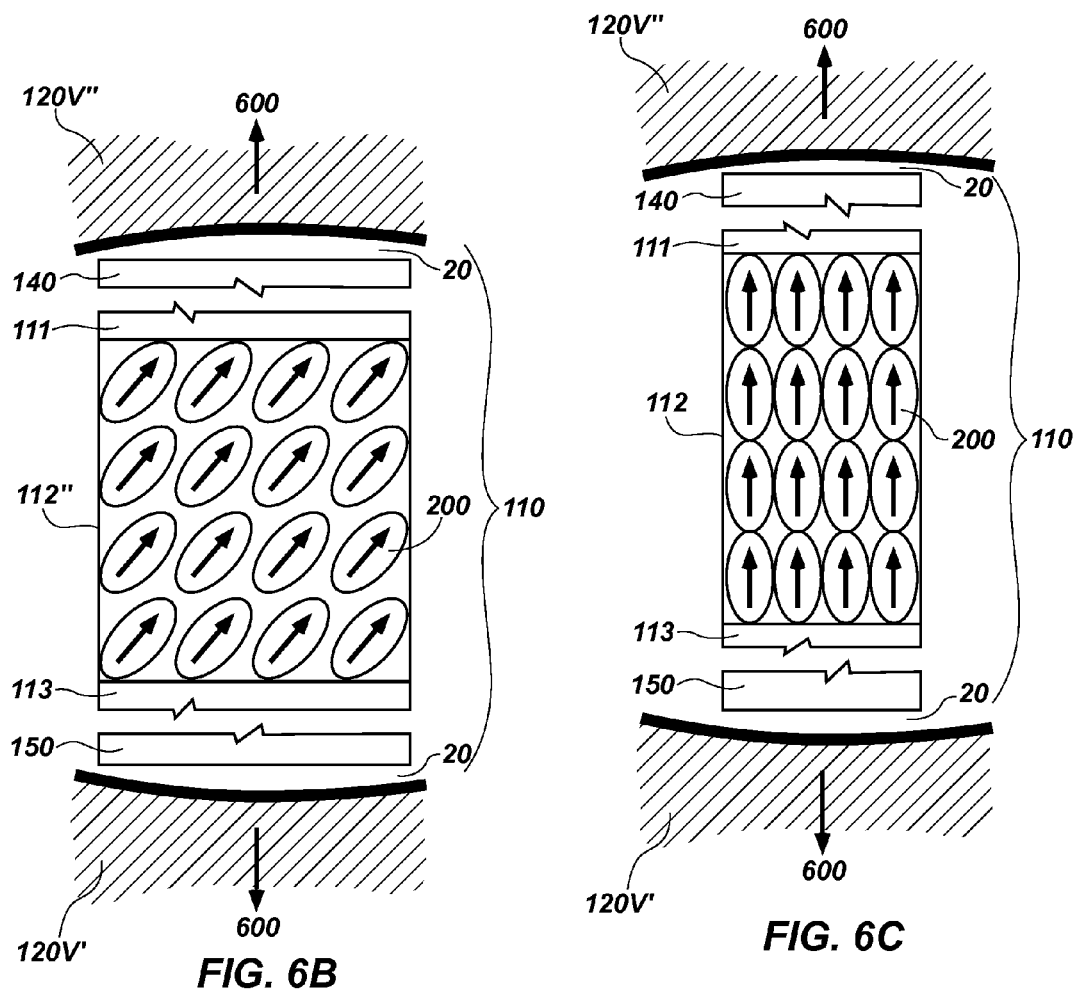
FIG. 6B
FIG. 6C

MAGNETIC MEMORY CELLS AND METHODS OF FORMATION

CROSS-REFERENCE TO RELATED APPLICATION

This application is a continuation of U.S. patent application Ser. No. 13/427,339, filed Mar. 22, 2012, now U.S Pat. No. 9,007,818, issued Apr. 14, 2015, the disclosure of which is hereby incorporated in its entirety herein by this reference.

FIELD

The present disclosure, in various embodiments, relates generally to the field of memory device design and fabrication. More particularly, the present disclosure relates to design and fabrication of memory cells characterized as Spin Torque Transfer Magnetic Random Access Memory (STT-MRAM).

BACKGROUND

Magnetic Random Access Memory (MRAM) is a non-volatile computer memory technology based on magnetoresistance. MRAM is non-volatile and so can maintain memory content when the memory device is not powered. MRAM data is stored by magnetoresistive elements. Generally, the magnetoresistive elements in an MRAM cell are made from two magnetic regions, each of which accepts and sustains magnetization. The magnetization of one region (the "pinned region") is fixed in its magnetic orientation, and the magnetization orientation of the other region (the "free region") can be changed. Thus, a programming current can cause the magnetic orientations of the two magnetic regions to be either parallel, giving a lower electrical resistance across the magnetoresistive elements (which may be defined as a "0" state), or antiparallel, giving a higher electrical resistance across the magnetoresistive elements (which may be defined as a "1" state) of the MRAM cell. The switching of the magnetic orientation of the free region and the resulting high or low resistance states across the magnetoresistive elements provide for the write and read operations of the typical MRAM cell.

One type of MRAM cell is a spin torque transfer MRAM (STT-MRAM) cell. A conventional STT-MRAM cell may include a magnetic cell core, which may include a magnetic tunnel junction (MTJ) or a spin valve structure. An MTJ is a magnetoresistive data storing element including two magnetic regions (one pinned and one free) and a non-magnetic, electrically insulating region in between, which may be accessed through data lines (e.g., bit lines), access lines (e.g., word lines), and an access transistor. A spin valve has a structure similar to the MTJ, except a spin valve has a conductive region in between the two magnetic regions.

In operation, a programming current may flow through the access transistor and the magnetic cell core. The pinned region within the cell core polarizes the electron spin of the programming current, and torque is created as the spin-polarized current passes through the core. The spin-polarized electron current interacts with the free region by exerting a torque on the free region. When the torque of the spin-polarized electron current passing through the core is greater than a critical switching current density ($J_c$) of the free region, the torque exerted by the spin-polarized electron current is sufficient to switch the direction of the magnetization of the free region. Thus, the programming current can be used to cause the magnetization of the free region to be aligned either parallel to or antiparallel to the magnetization of the pinned region, and, when the magnetization of the free region is switched between parallel and antiparallel, the resistance state across the core is changed.

The free regions and pinned regions of conventional STT-MRAM cells exhibit magnetization orientations that are horizontal, also known as "in-plane," with the width of the regions. Accordingly, the magnetization orientations are parallel (or antiparallel) to a plane defined by a primary surface of a substrate supporting the STT-MRAM cell. These wide, in-plane STT-MRAM cells have large footprints, making scaling of the cells below twenty-five nanometers a challenge.

Perpendicularly oriented STT-MRAM cells may require smaller cell widths than in-plane STT-MRAM cells, accommodating greater cell packing. Also, the associated perpendicular magnetizations (also known in the art as perpendicular magnetic anisotropy ("PMA")) of perpendicularly oriented STT-MRAM cells may have greatly reduced required switching voltage compared to an in-plane STT-MRAM cell. Therefore, efforts have been made to form perpendicularly oriented ("out-of-plane") STT-MRAM cells in which the pinned regions and the free regions exhibit vertical magnetization orientations. However, finding and implementing suitable materials and designs for the cell core to achieve the vertical magnetization orientations has been a challenge.

BRIEF DESCRIPTION OF THE DRAWINGS

FIGS. 6A through 6C are cross-sectional, elevation, schematic illustrations of a free region during various stages of application of vertical tensile stress according to an embodiment of the present disclosure;

DETAILED DESCRIPTION

Figure 1:
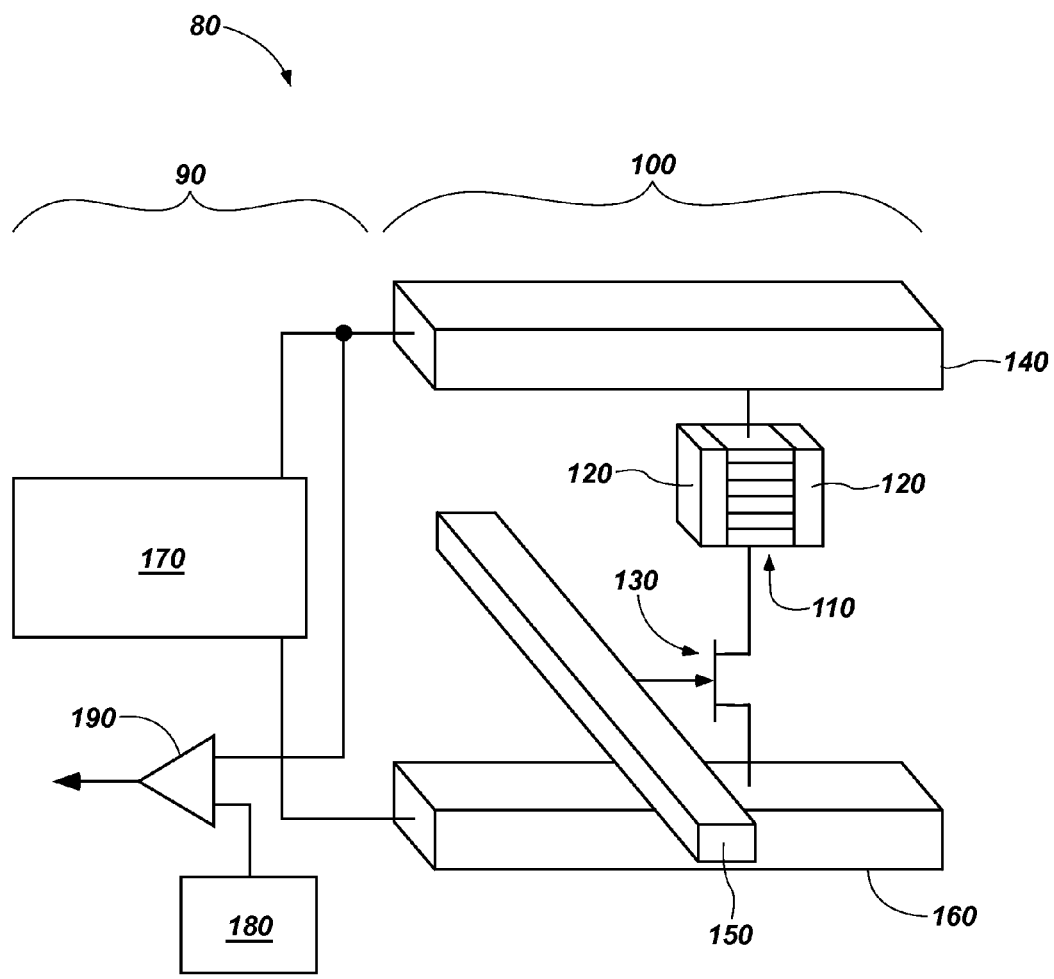
FIG. 1 is a schematic diagram of a portion of a memory array having memory cells fabricated according to an embodiment of the present disclosure.

Memory cells, semiconductor device structures including such memory cells, systems including arrays of such memory cells, and methods of forming such memory cells are disclosed. The memory cells include cell cores that have a free region exhibiting strain effecting a vertical magnetization orientation. Thus, the vertical magnetization orientation of the strained free region of the memory cell is influenced by the applied stress. The applied stress may be a mechanical stress, a thermal stress, or both. The applied stress and the effected vertical magnetization orientation exhibited by the free region may be permanent or temporary.

As used herein, the term "substrate" means and includes a base material or construction upon which components, such as those within memory cells, are formed. The substrate may be a semiconductor substrate, a base semiconductor material on a supporting structure, a metal electrode, or a semiconductor substrate having one or more materials, structures, or regions formed thereon. The substrate may be a conventional silicon substrate or other bulk substrate including a semiconductive material. As used herein, the term "bulk substrate" means and includes not only silicon wafers, but also silicon-on-insulator ("SOI") substrates, such as silicon-on-sapphire ("SOS") substrates or silicon-on-glass ("SOG") substrates, epitaxial layers of silicon on a base semiconductor foundation, or other semiconductor or optoelectronic materials, such as silicon-germanium ($Si_{1-x}Ge_x$, where x is, for example, a mole fraction between 0.2 and 0.8), germanium (Ge), gallium arsenide (GaAs), gallium nitride (GaN), or indium phosphide (InP), among others. Furthermore, when reference is made to a "substrate" in the following description, previous process stages may have been utilized to form materials, regions, or junctions in the base semiconductor structure or foundation.

As used herein, the term STT-MRAM cell means and includes a magnetic cell structure that may include an MTJ, as discussed above, if a non-magnetic region, disposed between the free region and the pinned region, is insulative. Alternatively, the magnetic cell structure of the STT-MRAM cell may include a spin valve, if the non-magnetic region, disposed between the free region and the pinned region, is conductive.

As used herein, the term "pinned region" means and includes a region of magnetic material within the STT-MRAM cell that has a fixed magnetization orientation during use and operation of the STT-MRAM cell. The fixed magnetization orientation of the pinned region may be influenced by an externally applied stress, which may be applied by a stressor structure, such that the pinned region may exhibit a strain. The magnetization orientation exhibited by the strained pinned region may be different, due to the application of the stress upon the pinned region, than it would be without application of the stress. Alternatively, the magnetization orientation exhibited by the pinned region may be uninfluenced by an applied stress, such that the magnetization exhibited by the strained pinned region would be the same regardless as a magnetization exhibited by a non-strained pinned region. The magnetization orientation of the pinned region of the present disclosure may exhibit a vertical magnetization orientation.

As used herein, the term "free region" means and includes a region of magnetic material within the STT-MRAM cell that has a switchable magnetization orientation during use and operation of the STT-MRAM cell. The magnetization orientation may be switched between a "parallel" direction, in which the magnetization orientation exhibited by the free region and the magnetization orientation exhibited by the pinned region are directed in the same direction, to an "antiparallel" direction, in which the magnetization orientation exhibited by the free region and the magnetization orientation exhibited by the pinned region are directed in opposite directions.

As used herein, the term "cell core" means and includes a memory cell structure comprising the free region and pinned region and through which, during operation of the memory cell, current flows to effect a parallel or antiparallel magnetic orientation within the free region.

As used herein, the term "vertical" means and includes a direction that is perpendicular to the width of the respective region. "Vertical" may also mean and include a direction that is perpendicular to a primary surface of a substrate supporting the STT-MRAM cell.

As used herein, the terms "first," "second," "third," etc., may describe various elements, components, regions, materials, and/or sections, none of which are limited by these terms. These terms are used only to distinguish one element, component, region, material, or section from another element, component, region, material, or section. Thus, "a first element," "a first component," "a first region," "a first material," or "a first section" discussed below could be termed a second element, a second component, a second region, a second material, or second section without departing from the teachings herein.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (rotated 90 degrees, inverted, etc.) and the spatially relative descriptors used herein interpreted accordingly.

As used herein, reference to an element as being "on" or "over" another element means and includes the element being directly on top of, adjacent to, underneath, or in direct contact with the other element. It also includes the element being indirectly on top of, adjacent to, underneath, or near the other element, with other elements present therebetween. In contrast, when an element is referred to as being "directly on" another element, there are no intervening elements present.

As used herein, the terms "comprises," "comprising," "includes," and/or "including" specify the presence of stated features, regions, integers, stages, operations, elements, materials, components, and/or groups, but do not preclude the presence or addition of one or more other features, regions, integers, stages, operations, elements, materials, components, and/or groups thereof.

As used herein, "and/or" includes any and all combinations of one or more of the associated listed items.

As used herein, the singular forms "a," "an," and "the" are intended to include the plural forms as well, unless the context clearly indicates otherwise.

The illustrations presented herein are not meant to be actual views of any particular material, component, structure, device, or system, but are merely idealized representations that are employed to describe embodiments of the present disclosure.

Embodiments are described herein with reference to the illustrations. Variations from the shapes of the illustrations as a result, for example, of manufacturing techniques and/or tolerances, are to be expected. Thus, embodiments described herein are not to be construed as being limited to the particular shapes or regions as illustrated but include deviations in shapes that result, for example, from manufacturing. For example, a region illustrated or described as box-shaped may have rough and/or nonlinear features. Moreover, sharp angles that are illustrated may be rounded. Thus, the regions illustrated in the figures are schematic in nature and their shapes are not intended to illustrate the precise shape of a region and do not limit the scope of the present claims.

The following description provides specific details, such as material types and processing conditions, in order to provide a thorough description of embodiments of the disclosed devices and methods. However, a person of ordinary skill in the art will understand that the embodiments of the devices and methods may be practiced without employing these specific details. Indeed, the embodiments of the devices and methods may be practiced in conjunction with conventional semiconductor fabrication techniques employed in the industry.

The fabrication processes described herein do not form a complete process flow for processing semiconductor device structures. The remainder of the process flow is known to those of ordinary skill in the art. Accordingly, only the methods and semiconductor device structures necessary to understand embodiments of the present devices and methods are described herein.

Unless the context indicates otherwise, the materials described herein may be formed by any conventional technique including, but not limited to, spin coating, blanket coating, chemical vapor deposition ("CVD"), plasma enhanced CVD, atomic layer deposition ("ALD"), plasma enhanced ALD, or physical vapor deposition ("PVD"). Alternatively, the materials may be grown in situ. Depending on the specific material to be formed, the technique for depositing or growing the material may be selected by a person of ordinary skill in the art.

Reference will now be made to the drawings, where like numerals refer to like components throughout. The drawings are not necessarily to scale.

A memory cell is disclosed. The memory cell includes a magnetic cell core having a free region exhibiting strain. The strain effects a vertical magnetization orientation.

FIG. 1 illustrates an STT-MRAM system 80 that includes periphery devices 90 in operable communication with an STT-MRAM cell 100, a plurality of which may be fabricated to form an array of memory cells in a grid pattern including a number of rows and columns, or in various other arrangements, depending on the system requirements and fabrication technology. The STT-MRAM cell 100 includes a cell core 110, an access transistor 130, a conductive material that may function as a bit line 140, a conductive material that may function as a word line 150, and a conductive material that may function as a source line 160. The periphery devices 90 of the STT-MRAM system 80 may include read/write circuitry 170, a bit line reference 180, and a sense amplifier 190. The cell core 110 may include a magnetic tunnel junction (MTJ), including a free region and a pinned region. The STT-MRAM cell 100 may also include at least one stressor structure 120, which is external to the cell core 110. As used herein, a structure "external" to another structure may include a structure that is physically isolated from the another structure, a structure that is electrically isolated from the another structure, a structure that is not in electrical communication with the another structure, a structure that is not positioned vertically between the uppermost region of the cell core 110 that is in electrical communication with the bit line 140 and the lowermost region of the cell core 110 that is in electrical communication with the word line 150, or a combination thereof.

In use and operation, when the STT-MRAM cell 100 is selected to be programmed, a programming current is applied to the STT-MRAM cell 100, and the current is spin-polarized by the pinned region and exerts a torque on the free region, which switches the magnetization of the free region to "write to" or "program" the STT-MRAM cell 100. In a read operation of the STT-MRAM cell 100, a current is used to detect the resistance state of the cell core 110. The stressor structure 120 may exert a stress upon at least a portion of the cell core 110. Due to the application of the stress, a free region within the cell core 110 may exhibit a strain effecting a vertically oriented magnetization exhibited by the free region within the cell core 110, which vertical orientation may decrease the critical switching current required to switch the magnetization of the free region, thus allowing a smaller programming current to write the STT-MRAM cell 100. The vertical magnetization orientation may further allow for use of a cell core 110 with a smaller lateral dimension, thus allowing for improved scalability and device density.

As previously discussed, a programming current is applied for the write operation of the STT-MRAM cell 100. To initiate the programming current, the read/write circuitry 170 may generate a write current to the bit line 140 and the source line 160. The polarity of the voltage between the bit line 140 and the source line 160 determines the switch in magnetization of the free region in the cell core 110. Once the free region is magnetized according to the spin polarity of the programming current, the programmed state is written to the STT-MRAM cell 100.

To read the STT-MRAM cell 100, the read/write circuitry 170 generates a read current to the bit line 140 and the source line 160 through the cell core 110 and the access transistor 130. The programmed state of the STT-MRAM cell 100 relates to the resistance across the cell core 110, which may be determined by the voltage difference between the bit line 140 and the source line 160. In some embodiments, the voltage difference may be compared to the bit line reference 180 and amplified by the sense amplifier 190.

Figure 2A:
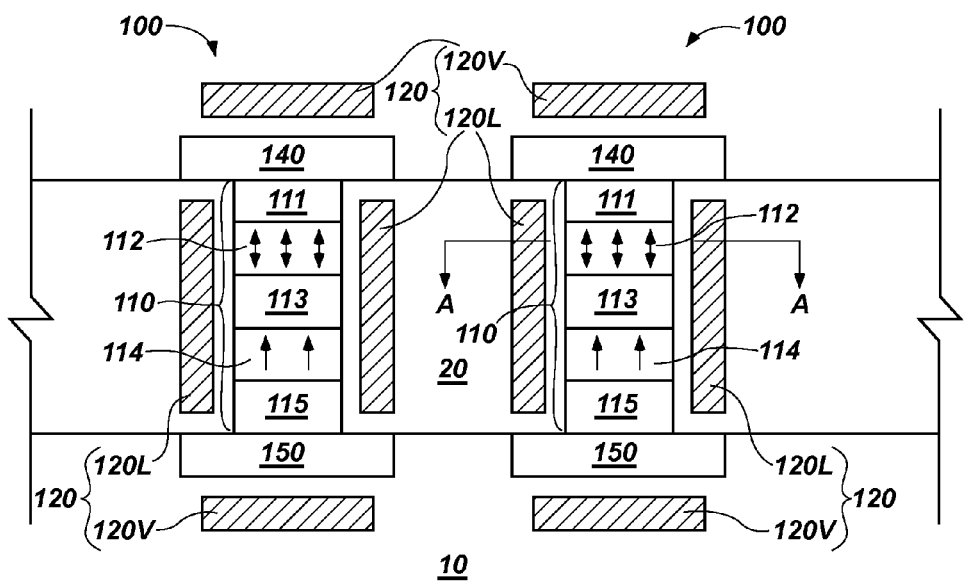
FIGS. 2A through 2F are cross-sectional, elevation, schematic illustrations of STT-MRAM cells according to embodiments of the present disclosure.

FIG. 2A illustrates a plurality of STT-MRAM cells 100 according to an embodiment of the present disclosure. Each STT-MRAM cell 100 includes a cell core 110 supported by a substrate 10. The cell core 110 includes a free region 112 and a pinned region 114. A non-magnetic region 113, which may be conductive or insulative, is disposed between the free region 112 and the pinned region 114. The cell core 110 forms an MTJ if the non-magnetic region 113 is insulative, or forms a spin valve if the non-magnetic region 113 is conductive. In embodiments in which the cell core 110 forms an MTJ, the non-magnetic region 113 between the free region 112 and the pinned region 114 may serve as an insulator between the two regions 112, 114. The non-magnetic region 113 may be formed from or comprise $Al_xO_y$, MgO, AlN, SiN, $CaO_x$, $NiO_x$, $Hf_xO_y$, $Ta_xO_y$, $Zr_xO_y$, $NiMnO_x$, $Mg_xF_y$, SiC, $SiO_2$, $SiO_xN_y$, or any combination of the above materials.

The free region 112 and pinned region 114 may be formed from or comprise ferromagnetic materials, such as Co, Fe, Ni or its alloys, NiFe, CoFe, CoNiFe, or doped alloys CoX, CoFeX, CoNiFeX (X=B, Cu, Re, Ru, Rh, Hf, Pd, Pt, C), or other half-metallic ferromagnetic material such as NiMnSb and PtMnSb, for example. More particularly, for example, the free region 112 may be formed from or comprise one or more of a material exhibiting magnetostriction (e.g., without limitation, $Co_xFe_yB_z$), a material exhibiting an $L1_0$ crystal structure, a material exhibiting a uniaxial magnetic anisotropy, and a Heusler alloy, which characteristics are not mutually exclusive. Alternatively or additionally, in some embodiments, the free region 112 may be formed from or comprise layered materials. For example, and without limitation, the free region 112 may be formed from or comprise repeating layers of cobalt and platinum, with a layer of platinum disposed between layers of cobalt and vice versa. As another example, without limitation, the free region 112 may comprise repeating layers of cobalt and nickel, with a layer of nickel disposed between layers of cobalt and vice versa.

The pinned region 114 is so named because it has a fixed magnetization with a fixed or pinned preferred orientation, which is represented by the unidirectional arrow illustrated in the pinned region 114 of FIGS. 2A through 2F. The bidirectional arrow illustrated in the free region 112 represents that the free region 112 may be magnetized either in a direction parallel to the orientation of the pinned region 114, which gives a low resistance, or in a direction antiparallel to the orientation of the pinned region 114, which gives a high resistance.

The cell core 110 may optionally also include other regions in addition to the free region 112, non-magnetic region 113, and pinned region 114. For example, as illustrated in FIG. 2A, the cell core 110 may include an antiferromagnetic region 115, which may be situated below the pinned region 114 to achieve the pinning through exchange coupling. Additional non-magnetic regions may be included in the cell core 110. For example, another non-magnetic region 111 may be situated over the free region 112. Other regions within the cell core 110 may include any of piezoelectric regions, additional free regions, additional pinned regions, additional antiferromagnetic regions, or other regions of known STT-MRAM cells.

External to the cell core 110, at least one stressor structure 120 may be present. The stressor structure 120 exerts a stress, either directly or indirectly, upon the free region 112. The exerted stress may be due, at least in part, to the configuration and positioning of the stressor structure 120 relative to the free region 112. The stressor structure 120 may, directly or indirectly, exert a stress upon at least a portion of the cell core 110 to thereby effect a strain exhibited by the free region 112. The strained state of the free region 112 effects a vertical magnetization orientation in the free region 112. Accordingly, the stress exerted by the stressor structure 120 causes the strain exhibited by the free region 112, which effects the vertical magnetization orientation of the free region 112.

The stressor structure 120 may be formed of or comprise one or more stressor materials. Such stressor materials may include, for example and without limitation, SiO or $Si_3N_4$. In other embodiments, the stressor material may include, for example and without limitation, a spin-on glass material formulated to shrink substantially upon annealing. In still other embodiments, the stressor material may include, for example and without limitation, an amorphous material formulated to densify upon annealing.

The stressor structure 120 exerts a stress upon a neighboring material or structure, such as upon at least one region of the cell core 110 or an insulative material disposed between the stressor structure 120 and at least one region of the cell core 110. The stressor structure 120 may be configured and positioned to apply either a compressive stress or a tensile stress to a neighboring material. Additionally, the stressor structure 120 may be configured and positioned to exert an essentially lateral stress or an essentially vertical stress upon a neighboring material. As used herein, a "lateral stress" is a stress directed in a direction parallel with the width of the structure upon which the lateral stress is exerted. A lateral stress may be directed in a direction that is parallel with a plane defined by the primary surface of a substrate supporting the STT-MRAM cell in which the structure, upon which the lateral stress is exerted, is supported. Also, as used herein, a "vertical stress" is a stress directed in a direction parallel with the height of the structure upon which the vertical stress is exerted. A vertical stress may be directed in a direction that is perpendicular with the plane defined by the primary surface of the substrate supporting the STT-MRAM cell in which the structure, upon which the vertical stress is exerted, is supported.

In other embodiments, the stressor structure 120 may be configured and positioned to exert an angled stress upon the neighboring material. Therefore, the stressor structure 120 may exert a lateral compressive stress, a lateral tensile stress, a vertical compressive stress, a vertical tensile stress, an angled compressive stress, or an angled tensile stress upon at least one neighboring material, which neighboring material may be the free region 112 of the cell core 110 or another material disposed between the stressor structure 120 and the free region 112 of the cell core 110. It is contemplated that the material comprising the stressor structure 120 be selected so as to exert, following formation of the stressor structure 120, the desired amount of stress of the desired type (e.g., compressive or tensile), in the desired direction (e.g., lateral, vertical, or angled) on the neighboring material so as to exhibit the desired strain by the free region 112 and to effect a vertical magnetization orientation within the strained free region 112 of the cell core 110.

As illustrated in FIG. 2A, the STT-MRAM cell 100 may include more than one stressor structure 120. For example, as shown, the STT-MRAM cell 100 may include a laterally adjacent stressor structure 120L and a vertically adjacent stressor structure 120V. Such laterally adjacent stressor structure 120L within the STT-MRAM cell 100 may be situated such that the cell core 110 is disposed laterally between at least two segments of the laterally adjacent stressor structure 120L. Such laterally adjacent segments of the laterally adjacent stressor structure 120L may be configured and positioned to exert, either directly or indirectly, a lateral stress, either compressive or tensile, upon at least the free region 112 of the cell core 110.

The vertically adjacent stressor structure 120V may be disposed above or below the cell core 110, or may be disposed both above and below the cell core 110, as shown in FIG. 2A. Such vertically adjacent stressor structures 120V may be configured and positioned to exert, either directly or indirectly, a vertical stress, either compressive or tensile, upon at least the free region 112 of the cell core 110.

The word line 150 of each STT-MRAM cell 100 may be formed in and supported by the substrate 10. The bit line 140 and word line 150 may be disposed between the cell core 110 and a vertically adjacent stressor structure 120V, as shown in FIG. 2A, and the conductive material forming the bit line 140 and the word line 150 may be in operable communication with the cell core 110. In such embodiments, the vertically adjacent stressor structures 120V may be configured and positioned to exert the vertical stress more directly upon each or either of the bit line 140 and the word line 150 before such vertical stress is indirectly exerted upon the free region 112 of the cell core 110.

In other embodiments (not shown), a vertically adjacent stressor structure 120V may be disposed, additionally or alternatively, between the bit line 140 and the cell core 110, such as between the bit line 140 and the non-magnetic region 111. Likewise, such embodiments may also or alternatively include a vertically adjacent stressor structure 120V disposed between the word line 150 and the cell core 110, such as between the word line 150 and the antiferromagnetic region 115.

The stressor structure 120 may be physically or electrically isolated, or both physically and electrically isolated, from the cell core 110. For example, an insulative material 20 may isolate the stressor structure 120 from the cell core 110. The insulative material 20 may be formed from or comprise known interlayer dielectric materials, such as, for example and without limitation, silicon dioxide.

The laterally adjacent segments of the stressor structure 120L may extend all or only a portion of a height defined by the cell core 110. For example, as shown in FIG. 2A, the laterally adjacent segments of laterally adjacent stressor structure 120L may extend all of a height defined by the free region 112, non-magnetic region 113, and pinned region 114 of the cell core 110 but may not physically contact or extend between the bit line 140 and word line 150.

The laterally adjacent segments of the at least one laterally adjacent stressor structure 120L may define a width that is less than or equal to a width defined by the wider of the bit line 140 and the word line 150. In such embodiments, therefore, the width of the wider of the bit line 140 and the word line 150 may define the width of the STT-MRAM cell 100.

Figure 2B:
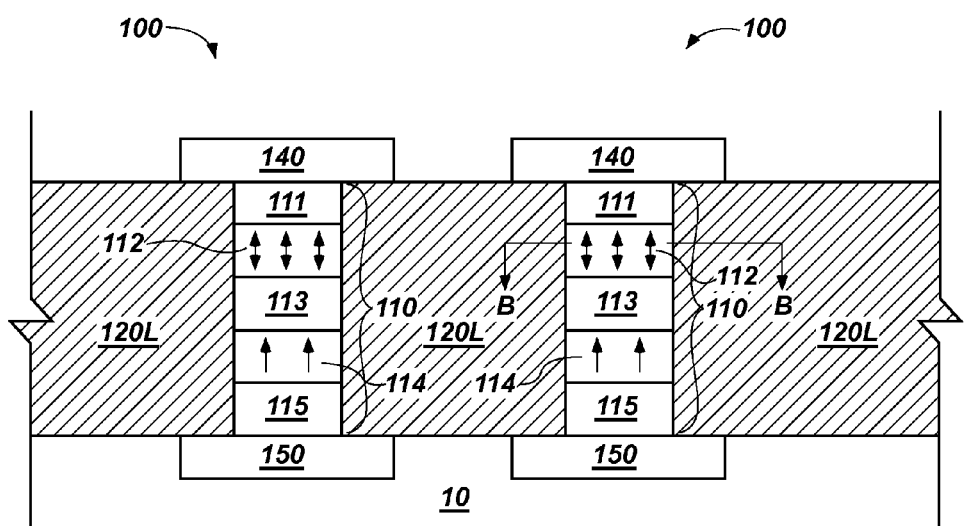

With reference to FIG. 2B, in some embodiments, the stressor structure 120 of the STT-MRAM cell 100 may not be physically isolated from the cell core 110. In such embodiments, the laterally adjacent stressor structure 120L may be formed directly on the cell core 110, such as being formed on sidewalls defined by the cell core 110. Such laterally adjacent stressor structure 120L may be in direct physical contact with one or more of the free region 112, the bit line 140, and the word line 150.

Also, as shown in FIG. 2B, in some embodiments, the laterally adjacent stressor structure 120L may extend the height of the cell core 110. The laterally adjacent stressor structure 120L may also span a distance between neighboring cell cores 110, rather than defining discrete segments of laterally adjacent stressor structure 120L between neighboring cell cores 110.

Figure 2C:
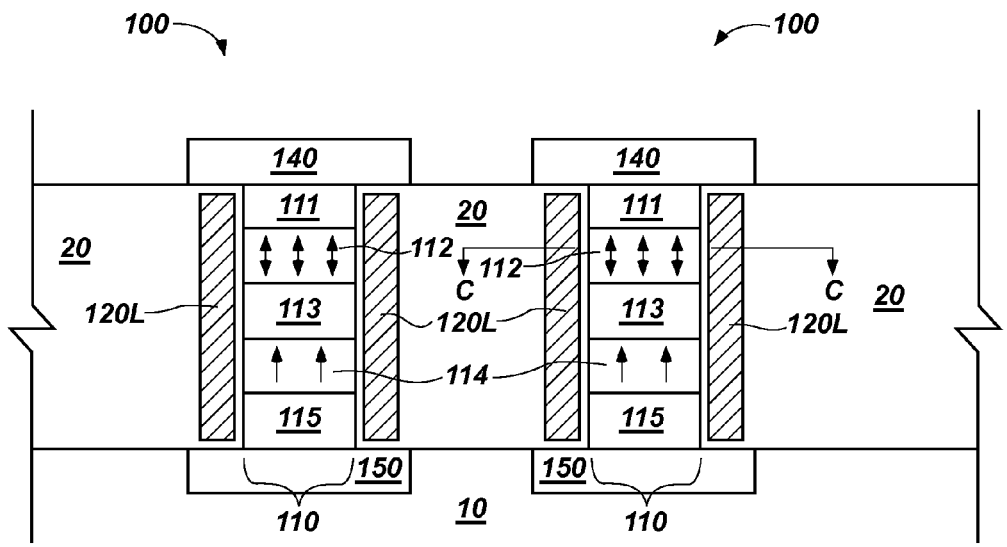

With reference to FIG. 2C, in some embodiments, the laterally adjacent stressor structure 120L may extend essentially the height of the cell core 110 while being physically and electrically isolated from the cell core 110 by insulative material 20.

Figure 2D:
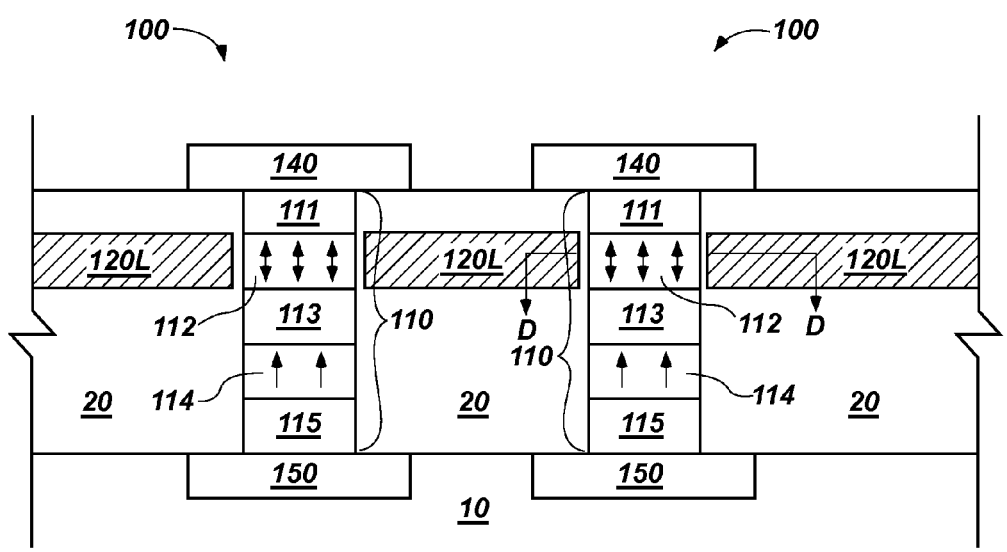

With reference to FIG. 2D, in some embodiments, the laterally adjacent stressor structure 120L may extend essentially only the height of the free region 112 of the cell core 110. Such laterally adjacent stressor structures 120L may essentially span between free regions 112 of neighboring cell cores 110 while being physically and electrically isolated from the cell core 110 by insulative material 20.

Figure 2E:
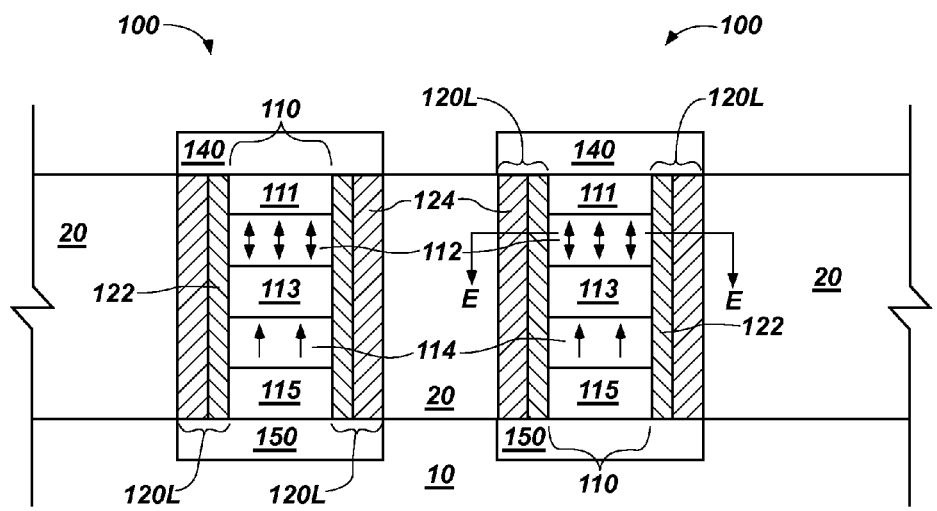

With reference to FIG. 2E, in some embodiments, the laterally adjacent stressor structure 120L includes more than one stressor material. Such laterally adjacent stressor structures 120L may include a first stressor material 122 proximate to the cell core 110 with a second stressor material 124 proximate to the first stressor material 122, the first stressor material 122 being disposed between the cell core 110 and the second stressor material 124. In other embodiments, more than two stressor materials may be included in the laterally adjacent stressor structure 120L. Though the laterally adjacent stressor structure 120L is illustrated as being in physical contact with the cell core 110, in other embodiments (not shown), the laterally adjacent stressor structure 120L of more than one stressor material may be electrically isolated, physically isolated, or both electrically and physically isolated from the cell core 110. Likewise, though the laterally adjacent stressor structure 120L is illustrated as extending the height of the cell core 110, in other embodiments (not shown), the laterally adjacent stressor structure 120L of more than one stressor material may extend only a portion of the height of the cell core 110, e.g., extending only along the height of the free region 112 of the cell core 110.

Figure 2F:
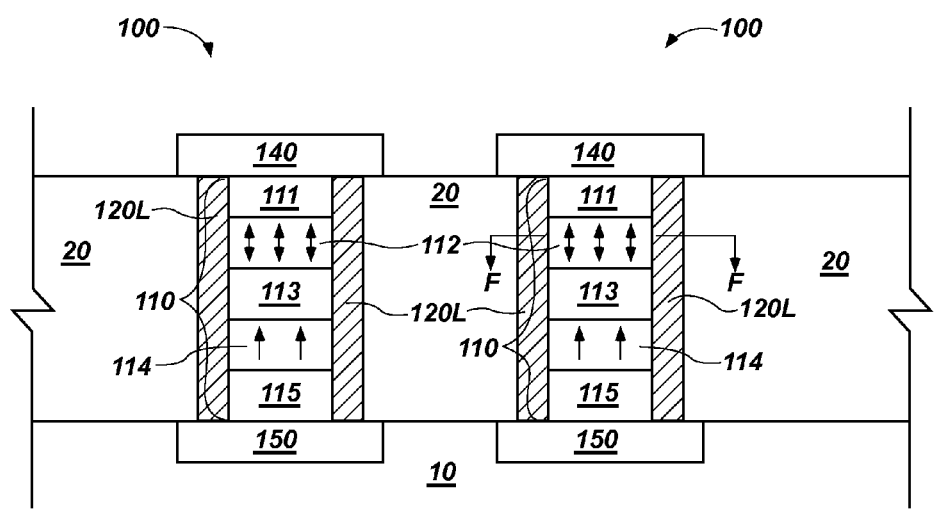
Figure 3A:
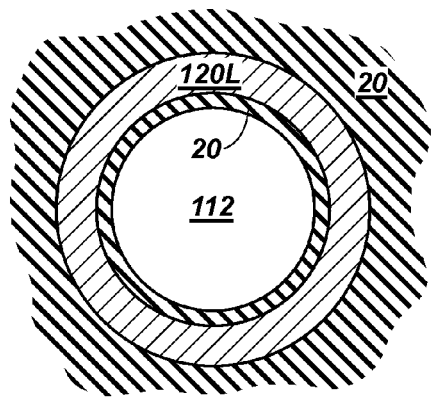
FIGS. 3A through 3F are cross-sectional, plan, schematic illustrations of the STT-MRAM cells of FIGS. 2A through 2F, respectively, taken along section lines A-A, B-B, C-C, D-D, E-E, and F-F, respectively, according to embodiments of the present disclosure.
Figure 3B:
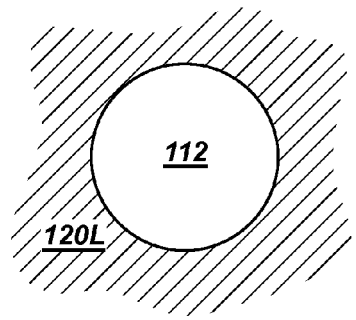
Figure 3C:
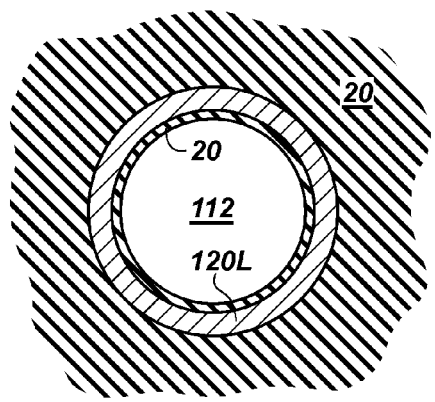
Figure 3D:
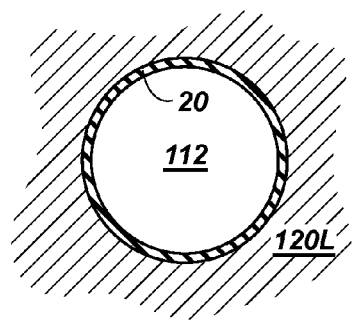
Figure 3E:
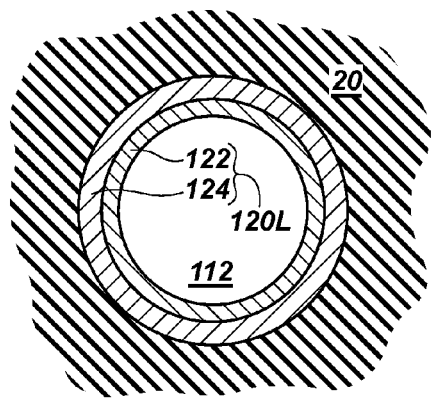
Figure 3F:
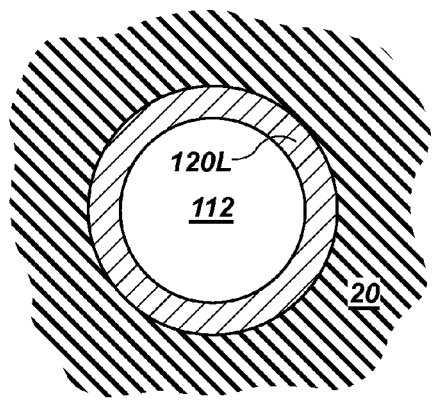
Figure 4A:
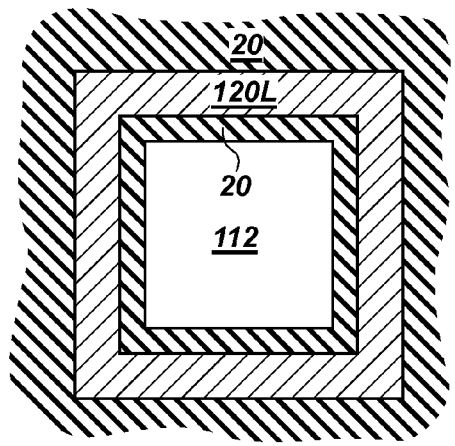
FIGS. 4A through 4F are cross-sectional, plan, schematic illustrations of the STT-MRAM cells of FIGS. 2A through 2F, respectively, taken along section lines A-A, B-B, C-C, D-D, E-E, and F-F, respectively, according to embodiments of the present disclosure.
Figure 4B:
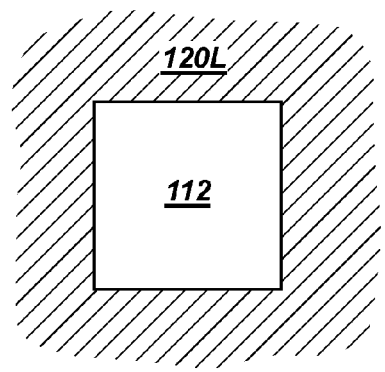
Figure 4C:
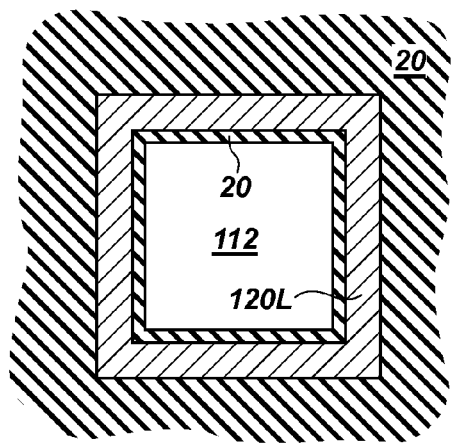
Figure 4D:
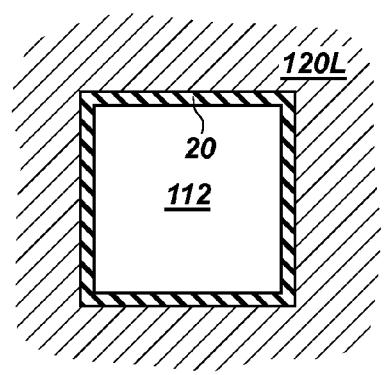
Figure 4E:
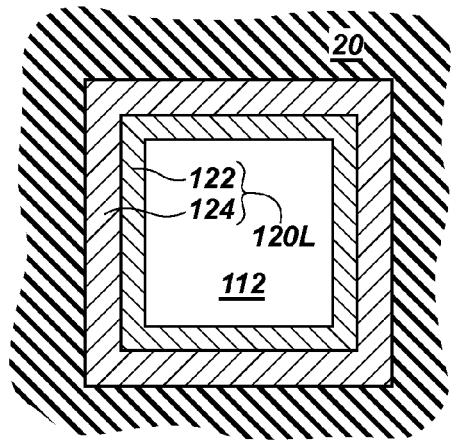
Figure 4F:
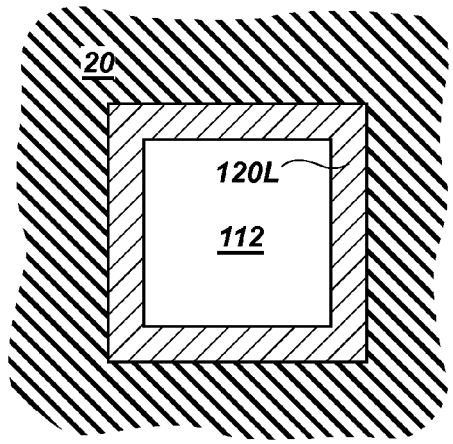

With reference to FIG. 2F, in some embodiments, the laterally adjacent stressor structure 120L may be directly adjacent and in contact with the cell core 110, while not spanning between neighboring cell cores 110.

In other embodiments (not shown), the STT-MRAM cell 100 may include vertically adjacent stressor structures 120V (e.g., FIG. 2A) of one or more materials in addition to the laterally adjacent stressor structures 120L illustrated in FIGS. 2B-2F. In such embodiments, the vertically adjacent stressor structures 120V may form discrete individual vertically adjacent stressor structures 120V relative to its respective STT-MRAM cell 100. In other such embodiments, the vertically adjacent stressor structures 120V may be continuous over and between a plurality of STT-MRAM cells 100. In still other such embodiments, the vertically adjacent stressor structures 120V may be formed of more than one material in a mixture or film structure.

In some embodiments, the cell core 110 may be essentially cylindrically shaped. In such embodiments, a laterally adjacent stressor structure 120L may surround the cell core 110, and the cell core 110 may be centrally disposed within the laterally adjacent stressor structure 120L. For example, FIGS. 3A through 3F illustrate a cross-sectional view taken along section lines A-A of FIG. 2A, B-B of FIG. 2B, C-C of FIG. 2C, D-D of FIG. 2D, E-E of FIG. 2E, and F-F of FIG. 2F, respectively.

In other embodiments, the cell core 110 may be essentially box shaped. In such embodiments, a laterally adjacent stressor structure 120L may surround the cell core 110, and the cell core 110 may be centrally disposed within the laterally adjacent stressor structure 120L. For example, FIGS. 4A through 4F illustrate a cross-sectional view taken along section lines A-A of FIG. 2A, B-B of FIG. 2B, C-C of FIG. 2C, D-D of FIG. 2D, E-E of FIG. 2E, and F-F of FIG. 2F, respectively.

In other embodiments (not shown), a laterally adjacent stressor structure 120L is formed in discrete segments such that the laterally adjacent stressor structure 120L does not completely laterally surround the cell core 110. In such embodiments, segments of the laterally adjacent stressor structure 120L may be laterally adjacent to only one or some, but not all, sides of the cell core 110, such as, laterally adjacent to a pair of sides of the cell core 110, as for example, shown in FIG. 1.

Further disclosed is a method of forming a memory cell. The method includes forming a cell core and applying a stress to the cell core to affect a magnetization orientation exhibited by a material within the cell core.

Forming the memory cell may include forming a cell core including a free region 112 and forming a stressor structure 120 isolated from the free region 112 by insulative material 20. The cell core with free region 112 may be formed using conventional methods, which are not described in detail herein. Likewise, insulative material 20 may be formed on sidewalls of the free region 112 using conventional methods. The laterally adjacent stressor structure 120L may be formed on sidewalls of either the free region 112, in embodiments in which no insulative material 20 isolates the laterally adjacent stressor structure 120L and the free region 112, or may be formed on the insulative material 20. The stressor structure 120 may be formed by conventional techniques, such as plasma-enhanced CVD, under parameters (e.g., flow rates, temperatures, pressures, concentrations, exposure times) appropriate to form a stressor structure 120 exerting stress upon at least one neighboring material, which such neighboring material may be the free region 112 or the insulative material 20, for example. The stress exerted by the stressor structure 120 may be due to thermal mismatch during temperature changes in the fabrication process, due to volume expansion and shrinkage (e.g., due to a differing coefficient of thermal expansion between the stressor material comprising the stressor structure 120 and a coefficient of thermal expansion of the neighboring material), or due to lattice mismatch stress due to material compositions and impurities within the material comprising the stressor structure 120, or any combination thereof. In other embodiments, such as those in which the stressor structure 120 includes a spin-on glass material formulated to shrink upon annealing, the stress exerted by the stressor structure 120 may be generated upon the shrinkage of the stressor material. In still other embodiments, such as those in which the stressor structure 120 includes an amorphous material formulated to densify upon annealing, the stress exerted by the stressor structure 120 may be generated due to the densification of the stressor material.

Figure 5A:
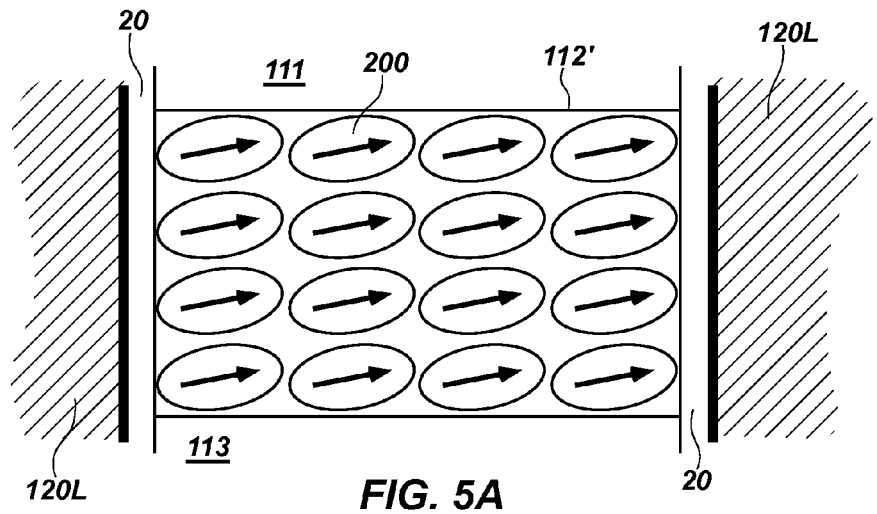
FIGS. 5A through 5C are cross-sectional, elevation, schematic illustrations of a free region during various stages of application of lateral compressive stress according to an embodiment of the present disclosure.
Figure 5B:
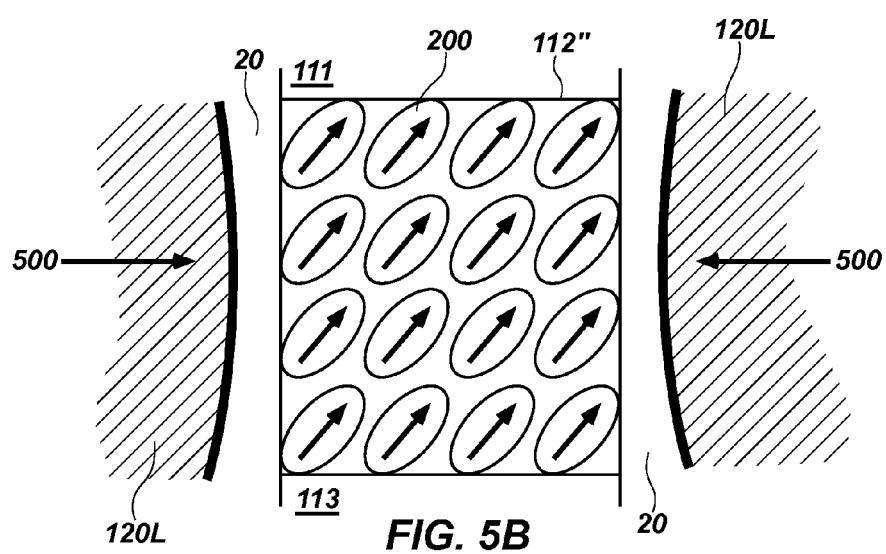
Figure 5C:
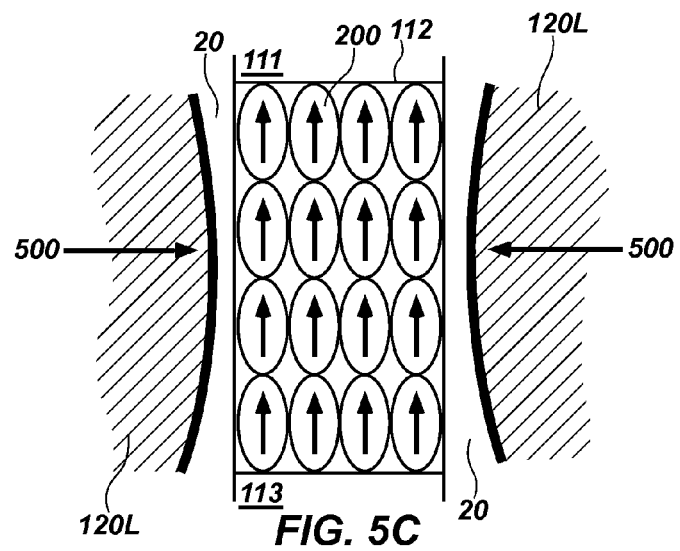

With reference to FIGS. 5A-5C, for example, forming a memory cell including a cell core with laterally adjacent stressor structure 120L may include forming the cell core 110 (FIGS. 2A-2F) with a free region 112', and, at initial formation, the free region 112' may not exhibit a strain. Insulative material 20 may be formed on sidewalls of the cell core 110, and the laterally adjacent stressor structure 120L may be formed on the insulative material 20. In other embodiments, the laterally adjacent stressor structure 120L may be formed directly on the cell core 110. The free region 112' and laterally adjacent stressor structure 120L may, along with other materials of the memory cell, be formed at processing temperatures in excess of room and operating temperatures. At such processing temperatures, the laterally adjacent stressor structure 120L may exhibit physical properties, such as a lattice structure, that may change as the laterally adjacent stressor structure 120L, and other materials within the STT-MRAM cell 100 (FIGS. 2A-2F), cool to room or operating temperatures. For example, at initial formation, illustrated in FIG. 5A, the laterally adjacent stressor structure 120L may define a first structure. As the laterally adjacent stressor structure 120L cools, as illustrated in FIG. 5B, the laterally adjacent stressor structure 120L may expand at a greater rate than a neighboring material, e.g., insulative material 20, and therefore may intrude upon space previously occupied by the neighboring material and thereby exert a compressive stress upon the free region 112", causing the free region 112" to exhibit an amount of strain. This mismatch in expansion exerts a lateral compressive stress 500 upon the neighboring material, which strained material may thereafter carry forward the exerted stress by exerting at least a fraction of the lateral compressive stress 500 to its neighboring materials, which may include the free region 112" of the cell core 110 (FIGS. 2A-2F). Expansion may continue to a maximum expansion, as illustrated in FIG. 5C, which may be exhibited when the laterally adjacent stressor structure 120L and other materials within the STT-MRAM cell 100 (FIGS. 2A-2F) have cooled to room or operating temperatures. The laterally adjacent stressor structure 120L, the resulting lateral stress 500, and the state of strain of the free region 112 may remain essentially unchanged following completion of formation and cooling of the laterally adjacent stressor structure 120L and neighboring materials as they are during use and operation of the STT-MRAM cell 100 (FIGS. 2A-2F).

As also illustrated in FIGS. 5A-5C, the non-strained free region 112', upon initial formation, illustrated in FIG. 5A, may exhibit a magnetization orientation 200 that may be essentially horizontally disposed. The free region 112' may continue to exhibit such horizontally oriented magnetization orientation 200 in the absence of a state of strain caused by stress exerted on the free region 112'. However, as illustrated in FIG. 5B, as the lateral compressive stress 500 is exerted on the free region 112" by the laterally adjacent stressor structure 120L and the free region 112" takes on a strained state, the magnetization orientation 200 may be altered to a more vertical orientation compared to the magnetization orientation 200 exhibited by the free region 112' (FIG. 5A) at initial formation and not in a strained state. At the completion of the formation of the free region 112 and the laterally adjacent stressor structure 120L, as illustrated in FIG. 5C, the free region 112, now in a state of strain, may exhibit an essentially vertical magnetization orientation 200.

Though FIG. 5C illustrates an essentially vertical magnetization orientation 200 with upwardly pointed arrows, the represented upward direction may represent the magnetization direction exhibited by the strained free region 112 either when in parallel or when antiparallel with the magnetization direction exhibited by the pinned region 114 (FIGS. 2A-2F). Due to the parallel-to-antiparallel switching of the free region 112, an induced vertical magnetization orientation 200 within the free region 112, due to a lateral compressive stress, may, alternatively, be represented by a downwardly pointed arrow. Further, because the direction of the magnetization orientation 200 exhibited by a strained free region 112 under a lateral compressive stress 500 may depend on the material or materials comprising the free region 112, it should be understood that the present disclosure is not limited to achieving a vertical magnetization orientation within the strained free region 112 via a lateral stress that is compressive. In other embodiments, the material comprising the free region 112 may be such that exerting a lateral tensile stress, directly or indirectly, upon the free region 112 may exhibit the strain that affects the magnetization orientation within the free region 112 so as to achieve the desired vertical magnetization orientation therein. In such embodiments, therefore, the composition of the laterally adjacent stressor structure 120L and the technique for forming the laterally adjacent stressor structure 120L may be tuned to achieve a laterally adjacent stressor structure 120L configured to exert the lateral tensile stress, directly or indirectly, upon the free region 112.

With reference to FIGS. 6A-6C, illustrated is another embodiment. A method of forming the memory cell according to this embodiment includes forming a first vertically adjacent stressor structure 120V', forming the cell core 110 above the first vertically adjacent stressor structure 120V', and forming a second vertically adjacent stressor structure 120V" above the cell core 110. The stressor material or materials comprising the vertically adjacent stressor structures 120V', 120V" may be formulated such that, as a result of fabrication or other treatment, the material contracts away from neighboring materials, exerting a vertical tensile stress indirectly upon the free region 112, which is in a state of strain. Accordingly, at initial formation, the free region 112', not in a strained state, may exhibit an essentially horizontal magnetization orientation 200, as illustrated in FIG. 6A. As the vertically adjacent stressor structures 120V', 120V" contract, as, for example, during cooling, the vertically adjacent stressor structures 120V', 120V" exert a vertical tensile stress 600 upon neighboring materials, and therefore, indirectly exerts a vertical tensile stress 600 upon the free region 112", altering the direction of the magnetization orientation 200 of the somewhat-strained free region 112", as illustrated in FIG. 6B. After completion of fabrication, the vertically adjacent stressor structures 120V', 120V" continues to exert a vertical tensile stress 600 upon the free region 112 such that the strained free region 112 exhibits an essentially vertical magnetization orientation 200, as illustrated in FIG. 6C. The contraction of the vertically adjacent stressor structures 120V', 120V" and the resulting vertical stress 600 may be essentially unchanging following completion of formation and cooling of the vertically adjacent stressor structures 120V', 120V" and neighboring materials.

Again, though FIG. 6C illustrates an essentially vertical magnetization orientation 200 with upwardly pointed arrows, the represented upward direction may represent the magnetization direction exhibited by the strained free region 112 either when in parallel or when antiparallel with the magnetization direction exhibited by the pinned region 114 (FIGS. 2A-2F). An induced vertical magnetization orientation 200 within the strained free region 112 due to a vertical tensile stress may, alternatively, be represented by a downwardly pointed arrow (not depicted). Further, because the direction of the magnetization orientation 200 exhibited by a strained free region 112 under a vertical tensile stress 600 may depend on the material or materials comprising the free region 112, it should be understood that the present disclosure is not limited to achieving a vertical magnetization orientation within the free region 112 via a vertical stress that is tensile. In other embodiments, the materials comprising the free region 112 may be such that exerting a vertical compressive stress, directly or indirectly, upon the free region 112 may affect the magnetization orientation within the free region 112 so as to effect the desired vertical magnetization orientation in the strained free region 112. In such embodiments, therefore, the composition of the vertically adjacent stressor structures 120V', 120V" and the technique for forming the vertically adjacent stressor structures 120V', 120V" may be tailored to achieve vertically adjacent stressor structures 120V', 120V" configured to exert the vertical compressive stress, directly or indirectly, upon the free region 112.

In some embodiments, the free region 112 of the cell core 110 may exhibit a vertically oriented magnetization orientation 200 even when not in a strained state, i.e., when not under an externally exerted stress (e.g., the lateral compressive stress 500, the vertical tensile stress 600, a lateral tensile stress, or a vertical compressive stress). In such embodiments, the stressor structure 120 (e.g., laterally adjacent stressor structure(s) 120L, vertically adjacent stressor structure(s) 120V', 120V") according to the present embodiment may be formulated and configured to maintain the vertical magnetization orientation exhibited by the strained free region 112.

In other embodiments, the free region 112 of the cell core 110 may be formed in a non-strained state, i.e., not under an externally exerted stress. The material forming such free region 112 may be formulated to exhibit a vertically oriented magnetization orientation 200 when, during use of the cell core 110, the local temperature of the cell increases. The increase in temperature during use may exert a stress on the free region 112 so as to effect a temporary vertically oriented magnetization orientation 200. The stress may be caused by thermally induced expansion of the free region 112, to thermally induced expansion of one or more neighboring materials, or to both. For example, during read or write of the cell, the local temperature may increase, exerting the stress upon the free region 112 such that it will be in a strained state and exhibit a vertically oriented magnetization orientation 200. Following use of the cell, the local temperature may decrease, relieving the stress, and transitioning the free region 112 back to the non-strained state. In the non-strained state, the free region 112 may no longer exhibit the vertically oriented magnetization orientation 200. Such embodiments may not include a stressor structure 120. Thus, the stress exerted on the free region 112 may be either permanent or temporary and may be one or more of a mechanical stress and a thermal stress.

Figure 7:
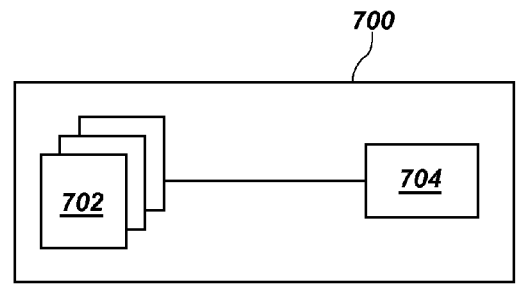
FIG. 7 is a simplified block diagram of a semiconductor device including memory cells of an embodiment of the present disclosure.

Also disclosed is a semiconductor device structure including at least one STT-MRAM cell, e.g., an array of STT-MRAM cells. With reference to FIG. 7, illustrated is a simplified block diagram of a semiconductor device structure 700 implemented according to one or more embodiments described herein. The semiconductor device structure 700 includes a memory array 702 and a control logic component 704. The memory array 702 may include a plurality of any of the STT-MRAM cells 100 depicted in FIG. 2A through FIG. 4F. The control logic component 704 may be configured to operatively interact with the memory array 702 so as to read from or write to any or all memory cells (e.g., STT-MRAM cell 100) within the memory array 702.

Figure 8:
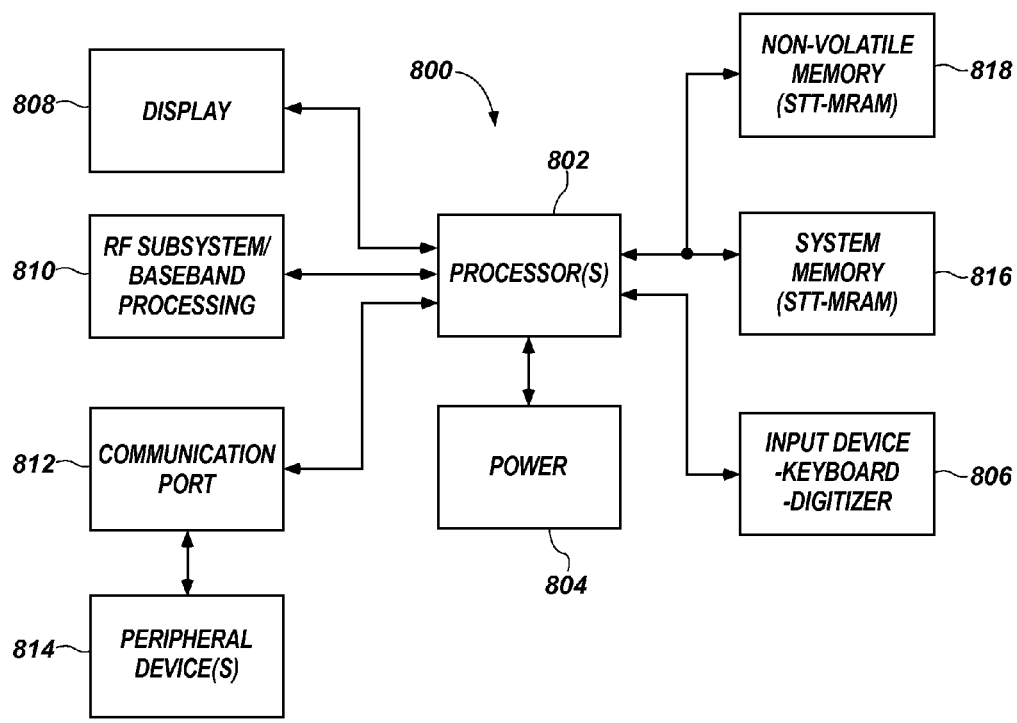
FIG. 8 is a simplified block diagram of a system implemented according to one or more embodiments described herein.

Also disclosed is a system including a memory array, e.g., memory array 702. With reference to FIG. 8, depicted is a processor-based system 800. The processor-based system 800 may include various electronic devices manufactured in accordance with embodiments of the present disclosure. The processor-based system 800 may be any of a variety of types such as a computer, pager, cellular phone, personal organizer, control circuit, or other electronic device. The processor-based system 800 may include one or more processors 802, such as a microprocessor, to control the processing of system functions and requests in the processor-based system 800. The processor 802 and other subcomponents of the processor-based system 800 may include magnetic memory devices manufactured in accordance with embodiments of the present disclosure.

The processor-based system 800 may include a power supply 804. For example, if the processor-based system 800 is a portable system, the power supply 804 may include one or more of a fuel cell, a power scavenging device, permanent batteries, replaceable batteries, and rechargeable batteries. The power supply 804 may also include an AC adapter; therefore, the processor-based system 800 may be plugged into a wall outlet, for example. The power supply 804 may also include a DC adapter such that the processor-based system 800 may be plugged into a vehicle cigarette lighter, for example.

Various other devices may be coupled to the processor 802 depending on the functions that the processor-based system 800 performs. For example, a user interface 806 may be coupled to the processor 802. The user interface 806 may include input devices such as buttons, switches, a keyboard, a light pen, a mouse, a digitizer and stylus, a touch screen, a voice recognition system, a microphone, or a combination thereof. A display 808 may also be coupled to the processor 802. The display 808 may include an LCD display, an SED display, a CRT display, a DLP display, a plasma display, an OLED display, an LED display, a three-dimensional projection, an audio display, or a combination thereof. Furthermore, an RF sub-system/baseband processor 810 may also be coupled to the processor 802. The RF sub-system/baseband processor 810 may include an antenna that is coupled to an RF receiver and to an RF transmitter (not shown). A communication port 812, or more than one communication port 812, may also be coupled to the processor 802. The communication port 812 may be adapted to be coupled to one or more peripheral devices 814, such as a modem, a printer, a computer, a scanner, a camera, or to a network, such as a local area network, remote area network, intranet, or the Internet, for example.

The processor 802 may control the processor-based system 800 by implementing software programs stored in the memory. The software programs may include an operating system, database software, drafting software, word processing software, media editing software, or media playing software, for example. The memory is operably coupled to the processor 802 to store and facilitate execution of various programs. For example, the processor 802 may be coupled to system memory 816, which may include one or more of spin torque transfer magnetic random access memory (STT-MRAM), magnetic random access memory (MRAM), dynamic random access memory (DRAM), static random access memory (SRAM), and other known memory types. The system memory 816 may include volatile memory, non-volatile memory, or a combination thereof. The system memory 816 is typically large so that it can store dynamically loaded applications and data. In some embodiments, the system memory 816 may include semiconductor device structures, such as the semiconductor device structures 700 of FIG. 7, memory cells such as the STT-MRAM cells 100 of any of FIGS. 2A through 4F, or both.

The processor 802 may also be coupled to non-volatile memory 818, which is not to suggest that system memory 816 is necessarily volatile. The non-volatile memory 818 may include one or more of STT-MRAM, MRAM, read-only memory (ROM) such as an EPROM, resistive read-only memory (RROM), and flash memory to be used in conjunction with the system memory 816. The size of the ROM is typically selected to be just large enough to store any necessary operating system, application programs, and fixed data. Additionally, the non-volatile memory 818 may include a high capacity memory such as disk drive memory, such as a hybrid-drive including resistive memory or other types of non-volatile solid-state memory, for example. The non-volatile memory 818 may include STT-MRAM devices formed in accordance with embodiments of the present disclosure, such as semiconductor device structures 700 of FIG. 7, memory cells such as the STT-MRAM cells 100 of any of FIGS. 2A through 4F, or both.

Accordingly, a memory cell is disclosed. The memory cell comprises a magnetic cell core comprising a free region exhibiting strain effecting a vertical magnetization orientation.

Also disclosed is a memory cell comprising a cell core. The cell core comprises a free region in a strained state exhibiting a vertical magnetization orientation. The cell core also comprises a pinned region and another region disposed between the free region and the pinned region.

Further disclosed is a method of forming a memory cell, the method comprising forming a cell core and applying a stress to the cell core to affect a magnetization orientation exhibited by a material within the cell core.

Still further disclosed is a semiconductor device structure comprising a spin torque transfer magnetic random access memory (STT-MRAM) array comprising a plurality of STT-MRAM cells. Each STT-MRAM cell of the plurality comprises a cell core comprising a strained free region exhibiting a vertical magnetization orientation. Each cell also comprises a stressor structure external to the cell core. The stressor structure stresses the strained free region.

Moreover, disclosed is a system comprising a memory array comprising a plurality of magnetic memory cells. Each magnetic memory cell of the plurality comprises at least one stressor structure applying a stress to a free region demonstrating a vertical magnetization orientation.

While the present disclosure is susceptible to various modifications and alternative forms in implementation thereof, specific embodiments have been shown by way of example in the drawings and have been described in detail herein. However, the present disclosure is not intended to be limited to the particular forms disclosed. Rather, the present disclosure encompasses all modifications, combinations, equivalents, variations, and alternatives falling within the scope of the present disclosure as defined by the following appended claims and their legal equivalents.

What is claimed is:

1. A magnetic memory cell, comprising:
    a cell core comprising:
        a free region exhibiting a vertical magnetic orientation;
        a pinned region exhibiting a vertical magnetic orientation; and
        a nonmagnetic region between the free region and the pinned region;
    a stressor structure external to the cell core and directly, laterally about at least a portion of the cell core, the stressor structure applying a stress to at least the portion of the cell core to effect a strain exhibited by the free region, the strain effecting the vertical magnetic orientation exhibited by the free region, the stressor structure defining a uniform lateral thickness along a height of the stressor structure;
    an insulative material directly, laterally about the stressor structure;
    a conductive material above the cell core and the stressor structure; and
    another conductive material beneath the cell core and the stressor structure.

2. The magnetic memory cell of claim 1, wherein the stressor structure comprises at least one of silicon oxide (SiO) and silicon nitride ($Si_3N_4$).

3. The magnetic memory cell of claim 1, wherein the stressor structure defines a width less than or equal to a width defined by at least one of the conductive material and the another conductive material.

4. The magnetic memory cell of claim 1, further comprising another stressor structure physically isolated from the cell core.

5. The magnetic memory cell of claim 1, wherein the stressor structure comprises a first stressor material and a second stressor material.

6. The magnetic memory cell of claim 5, wherein the first stressor material is disposed between the cell core and the second stressor material.

7. The magnetic memory cell of claim 1, further comprising another stressor structure vertically adjacent the cell core.

8. A method of forming a magnetic memory cell, the method comprising:
    forming a cell core comprising at least one magnetic region over a substrate;
    forming a stressor structure proximate to and isolated from the cell core, isolated from a conductive material directly above the cell core, and isolated from another conductive material directly beneath the cell core; and
    cooling the stressor structure and the cell core to contract the stressor structure and apply a stress upon at least the at least one magnetic region of the cell core, the stress effecting a strain in the at least one magnetic region that effects a vertical magnetic orientation exhibited by the at least one magnetic region.

9. The method of claim 8, wherein forming a stressor structure comprises forming a spin-on glass material.

10. The method of claim 8, wherein forming a stressor structure proximate to and isolated from the cell core comprises forming the stressor structure laterally surrounding at least a portion of the cell core.

11. The method of claim 10, further comprising forming another stressor structure proximate to and isolated from at least the portion of the cell core.

12. The method of claim 8, further comprising:
    forming the conductive material above the cell core and the stressor structure; and
    forming the another conductive material beneath the cell core and the stressor structure.

13. A magnetic memory cell, comprising:
    a stressor structure comprising silicon oxide;
    a cell core structure free of internal stressor material and extending through the stressor structure, the cell core structure comprising a magnetic tunnel junction comprising a magnetic region exhibiting a strain effected by a stress applied by the stressor structure, the strain effecting a vertical magnetic orientation exhibited by the magnetic region;
    an insulative material laterally adjacent the stressor structure;
    a conductive material above the stressor structure; and
    another conductive material beneath the stressor structure.

14. The magnetic memory cell of claim 13, wherein the stressor structure extends directly between the conductive material and the another conductive material.

15. The magnetic memory cell of claim 13, wherein the insulative material laterally surrounds the stressor structure.

16. The magnetic memory cell of claim 13, wherein the insulative material is further vertically about the stressor structure.

17. The magnetic memory cell of claim 13, wherein the vertical magnetic orientation exhibited by the magnetic region is a switchable vertical magnetic orientation.

18. The magnetic memory cell of claim 13, wherein the stressor structure contacts the cell core structure.

19. The magnetic memory cell of claim 13, wherein the stressor structure extends laterally beyond at least one of the conductive material and the another conductive material.

20. The magnetic memory cell of claim 13, wherein the stressor structure extends at least a height of the magnetic tunnel junction.

* * * * *